US008654580B2

(12) United States Patent
Kang et al.

(10) Patent No.: US 8,654,580 B2
(45) Date of Patent: Feb. 18, 2014

(54) NON-VOLATILE MEMORY DEVICES AND SYSTEMS INCLUDING THE SAME, AND METHODS OF PROGRAMMING NON-VOLATILE MEMORY DEVICES

(75) Inventors: Dong Ku Kang, Yongin-si (KR); Seung-Bum Kim, Hwaseong-si (KR); Tae-Young Kim, Seoul (KR); Sun-Jun Park, Daegu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 100 days.

(21) Appl. No.: 13/316,636

(22) Filed: Dec. 12, 2011

(65) Prior Publication Data

US 2012/0170365 A1 Jul. 5, 2012

(30) Foreign Application Priority Data

Jan. 4, 2011 (KR) ........................ 10-2011-0000359

(51) Int. Cl.
*G11C 16/04* (2006.01)
(52) U.S. Cl.
USPC ............ 365/185.03; 365/185.29; 365/185.11; 365/185.22
(58) Field of Classification Search
USPC .............. 365/185.03, 185.29, 185.11, 185.22
See application file for complete search history.

(56) References Cited

U.S. PATENT DOCUMENTS

| 6,862,222 | B2 * | 3/2005 | Roohparvar | 365/185.29 |
| 7,652,931 | B2 | 1/2010 | Park et al. | |
| 2008/0219053 | A1 | 9/2008 | Kim | |
| 2010/0118592 | A1 * | 5/2010 | Ishihara et al. | 365/148 |
| 2010/0226183 | A1 * | 9/2010 | Kim | 365/185.33 |

FOREIGN PATENT DOCUMENTS

| JP | 2010520571 | 6/2010 |
| KR | 1020080005765 A | 1/2008 |
| KR | 1020100015423 A | 2/2010 |
| KR | 1020100047560 A | 5/2010 |

* cited by examiner

*Primary Examiner* — Connie Yoha
(74) *Attorney, Agent, or Firm* — Volentine & Whitt, PLLC

(57) ABSTRACT

A method is for programming a memory block of a non-volatile memory device. The non-volatile memory device is operatively connected to a memory controller, and the memory block defined by a plurality of word lines located between a string select line and a common source line corresponding to the string select line. The method includes programming a first sub-block of the memory block, determining in the non-volatile memory device when a reference word line is programmed during programming of the first sub-block, and partial erasing a second sub-block of the memory block upon determining that the reference word line is programmed during programming of the first sub-block.

40 Claims, 19 Drawing Sheets

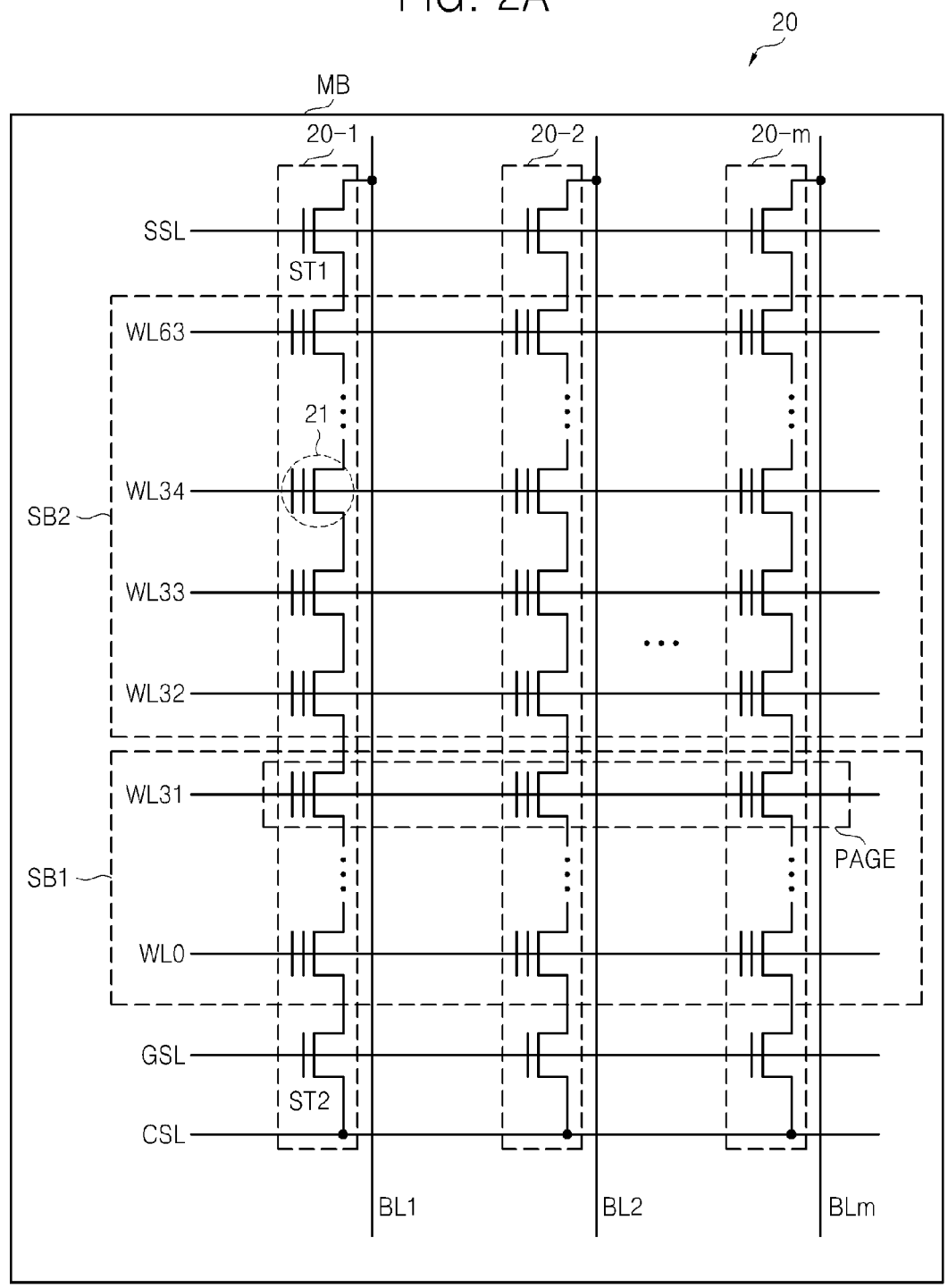

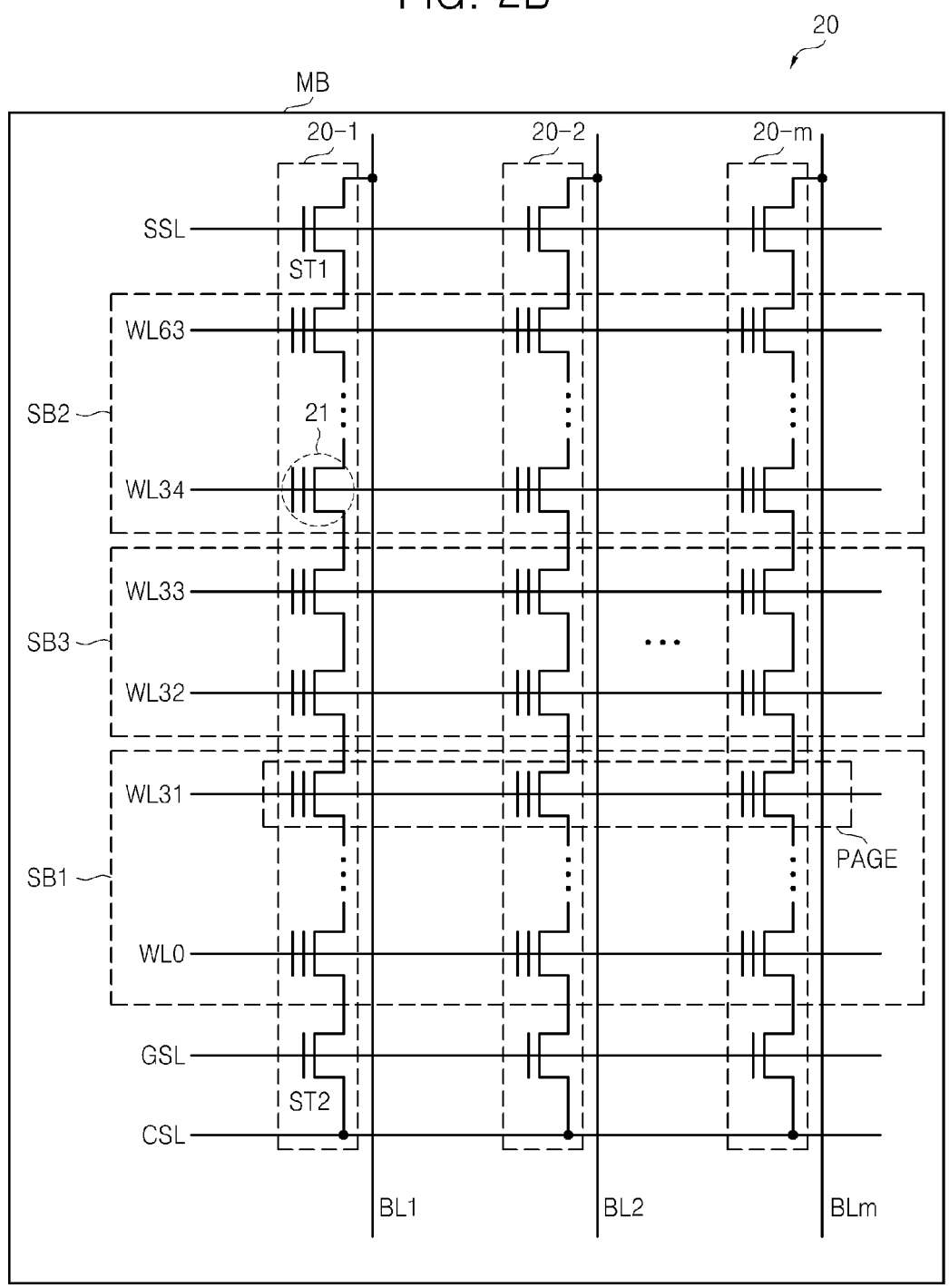

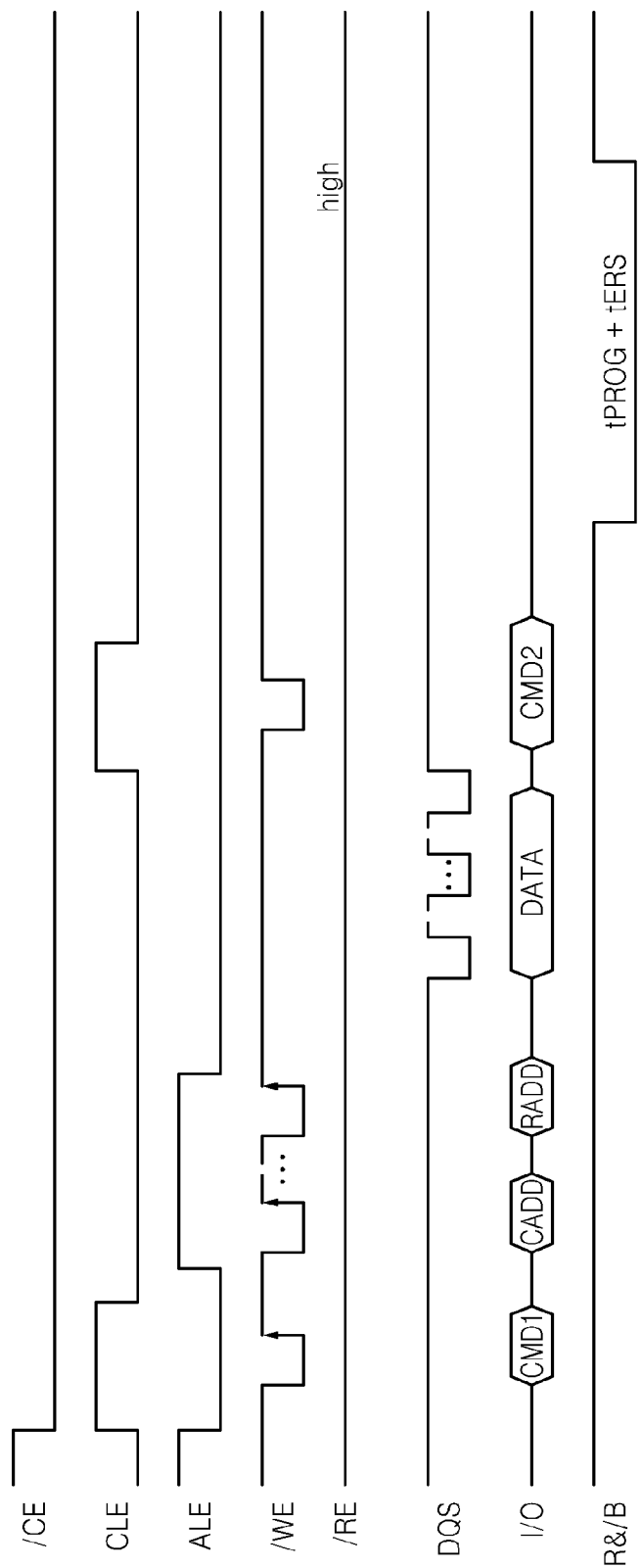

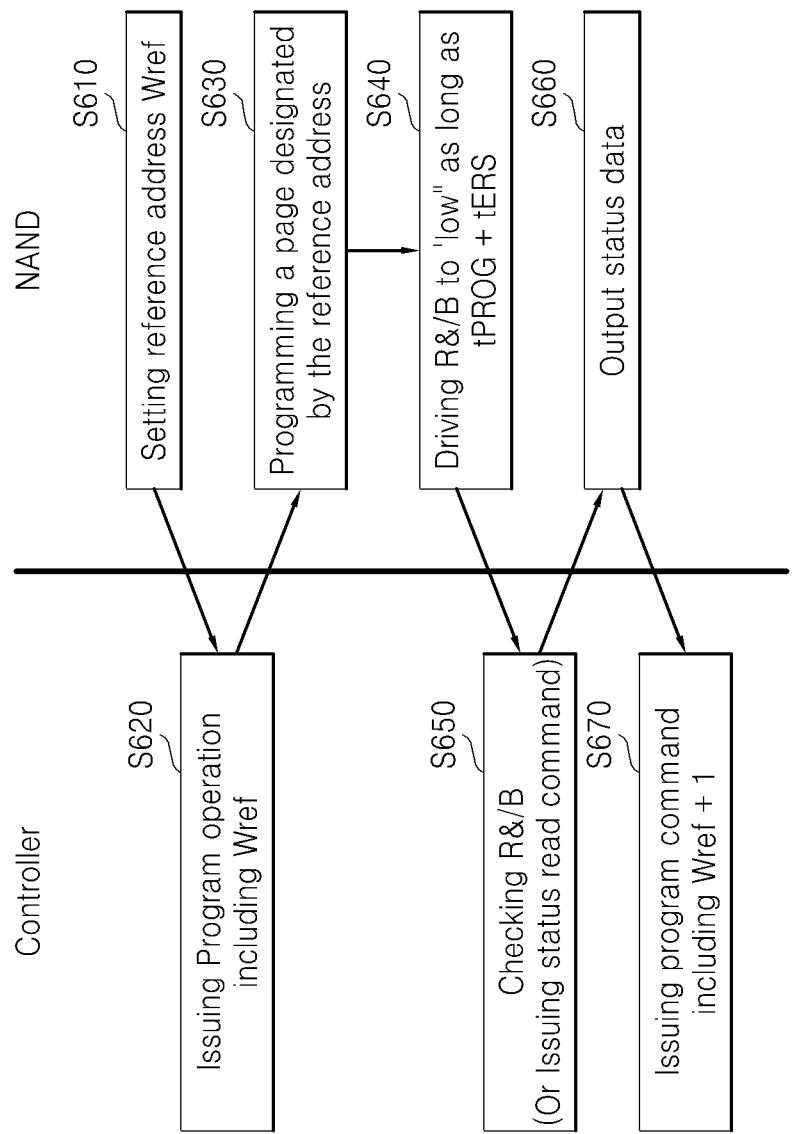

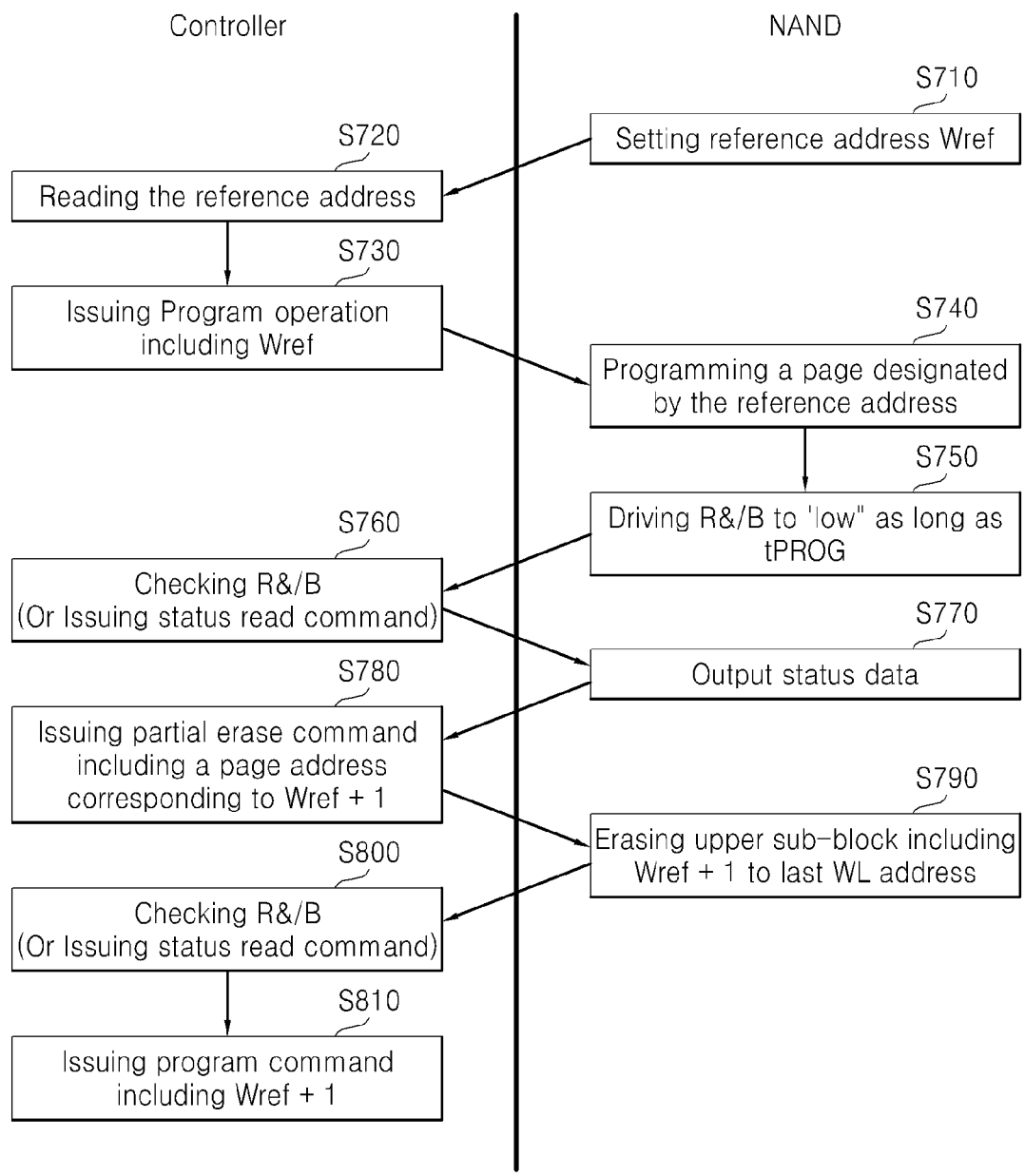

NON-VOLATILE MEMORY DEVICES AND SYSTEMS INCLUDING THE SAME, AND METHODS OF PROGRAMMING NON-VOLATILE MEMORY DEVICES

CROSS-REFERENCE TO RELATED APPLICATIONS

A claim of priority under 35 U.S.C. §119(a) is made to Korean Patent Application No. 10-2011-0000359, filed Jan. 4, 2011, the disclosure of which is hereby incorporated by reference in its entirety.

BACKGROUND

The inventive concepts generally relate to electronic devices, and more particular, the inventive concepts relate to non-volatile semiconductor memory devices, systems including non-volatile semiconductor memory devices, and methods of programming non-volatile semiconductor memory devices.

A variety of different types of non-volatile memory devices are known, including, for example, mask read-only memory (MROM) devices, programmable read-only memory (PROM) devices, erasable programmable read-only memory (EPROM) devices, and electrically erasable programmable read-only memory (EEPROM).

Developed from EEPROM technology, the NAND flash memory device has become widely adopted for non-volatile mass data storage applications. For example, NAND flash memory devices are commonly employed to store audio, image and/or video data in a myriad of different types of host devices, such as computers, mobile phones, personal digital assistants (PDAs), a digital cameras, camcorders, voice recorders, MP3 players, handheld personal computers (PCs), game consoles, facsimile machines, scanners, printers and so on.

Depending on the number of bits stored per memory cell, NAND flash memory devices are generally classified as either single level cell (SLC) devices or multi-level cells (MLC) devices. SLC devices store a single bit of data in each NAND flash memory cell, whereas MLC devices store 2 or more bits of data in each NAND flash memory cell.

In conventional nomenclature, the NAND flash memory cells connected to a same word line store one on or more "pages" of data. In particular, in the case of an SLC device, the NAND flash memory cells connected to a same word line store one page of data, where each bit of the page data is stored in a separate memory cell. In the case of an MLC device, the NAND flash memory cells connected to a same word line store multiple pages of data, where multiple bits of the respective page data are stored in a same memory cell. For example, in the case of an "n-bit" MLC device (n is 2 or more), the NAND flash memory cells connected to a same word line store "n" pages of data, where each memory cells stores "n" bits of data of the respective "n" pages.

NAND flash memory devices are generally characterized by being programmed and read in units of a page, and by being erased in units of memory "blocks", where each block includes a plurality of word lines (or pages) and a plurality of bit lines respectively connected to respective memory cell "strings." Each memory cell string is typically defined by a plurality of flash memory cells connected in series between a string selection transistor and a ground selection transistor.

The entire memory block is erased prior to programming, and the programming of each memory block generally includes sequential programming of word lines from a first word line closest to the ground selection transistor to the last word line closest to the string selection transistor.

SUMMARY

According to an aspect of the inventive concepts, a method of programming a memory block of a non-volatile memory device is provided. The non-volatile memory device is operatively connected to a memory controller, and the memory block defined by a plurality of word lines located between a string select line and a common source line corresponding to the string select line. The method includes programming a first sub-block of the memory block, determining in the non-volatile memory device when a reference word line is programmed during programming of the first sub-block, and partial erasing a second sub-block of the memory block upon determining that the reference word line is programmed during programming of the first sub-block.

According to another aspects of the inventive concepts, a method of programming a memory block of a non-volatile memory device is provided. The non-volatile memory device is operatively connected to a memory controller, and the memory block defined by a plurality of word lines located between a string select line and a common source line corresponding to the string select line. The method includes programming a first sub-block of the memory block, determining in the memory-controller when a reference word line is to be programmed during programming of the first sub-block, transmitting a partial erase command from the memory controller to the non-volatile memory device upon determining that the reference word line is programmed during programming of the first sub-block, partial erasing a second sub-block of the memory block in response to the partial erase command, and programming the second sub-block of the memory block after partial erasing the second sub-block.

According to still another aspect of the inventive concepts, a method of operating a non-volatile memory device is provided. The non-volatile memory device includes a memory block defined by a plurality of word lines located between a string select line and a common source line corresponding to the string select line. The method includes erasing the memory block including applying a first erase voltage to the plurality of word lines of the memory block, and partial erasing a least one word line of the memory block including applying a second erase voltage to the at least one word line, wherein the first erase voltage is different than the second erase voltage.

According to yet another aspect of the inventive concepts, a non-volatile memory device is provided which includes a non-volatile memory block defined by a plurality of word lines located between a string select line and a common source line corresponding to the string select line, and a control circuit configured to program a first sub-block of the memory block, to determine when a reference word line is programmed during programming of the first sub-block, and to partial erase a second sub-block of the memory block upon determining that the reference word line is programmed during programming of the first sub-block.

According to another aspect of the inventive concepts, a memory system is provided which includes a non-volatile memory device and memory controller. The non-volatile memory device includes a non-volatile memory block defined by a plurality of word lines located between a string select line and a common source line corresponding to the string select line, and a control circuit configured to execute program commands and partial erase commands on word lines of the non-volatile memory block. The memory controller is configured to transmit program commands to the non-volatile memory device to program a first sub-block of the memory block, to determine when a reference word line is programmed during programming of the first sub-block, to transmit a partial erase command from the memory controller to the non-volatile memory device upon determining that the reference word line is programmed during programming of the first sub-block, and to transmit program commands to the non-volatile memory device to program the second sub-block of the memory block after transmitting the partial erase command.

According to still another aspect of the inventive concepts, a method of operating a non-volatile memory device is provided. The method includes receiving an address, data, and a program command; and programming the data to a page defined by a word line corresponding to the address among a plurality of word lines connected to an NAND memory cell string in a memory block and erasing a sub-block ranging from a next word line following the word line corresponding to the address to a last word line in response to the program command.

According to yet another aspect of the inventive concepts, a method of operating a non-volatile memory device is provided. The method includes receiving an address, data, and a program command, programming the data to a page defined by a word line corresponding to the address among a plurality of word lines connected to an NAND memory cell string in a memory block in response to the program command, applying an intermediate voltage to at least one word line adjacent to the word line corresponding to the address in response to the program command, and erasing a sub-block ranging from a next word line following the at least one word line to a last word line in response to the program command.

According to another aspect of the inventive concepts, a non-volatile memory device is provided which includes a memory cell array including a memory block which includes an NAND memory cell string connected to a plurality of word lines, and an access control part configured to receive an address, data, and a program command, program the data to a page defined by a word line corresponding to the address among the plurality of word lines, and then automatically erase a sub-block ranging from a next word line following the word line corresponding to the address to a last word line.

According to another aspect of the inventive concepts, a non-volatile memory device is provided which includes a memory cell array including a memory block which includes an NAND memory cell string connected to a plurality of word lines, and an access control part configured to receive an address, data, and a program command, program the data to a page defined by a word line corresponding to the address among the plurality of word lines, apply an intermediate voltage to at least one word line adjacent to the word line corresponding to the address, and erase a sub-block ranging from a word line following the at least one word line to a last word line.

According to still another aspect of the inventive concepts, a memory system is provided which includes a non-volatile memory device, and a memory controller configured to control the non-volatile memory device The non-volatile memory device includes a memory cell array including a memory block which includes an NAND memory cell string connected to a plurality of word lines, and an access control part configured to receive an address, data, and a program command, program the data to a page defined by a word line corresponding to the address among the plurality of word lines, and then automatically erase a sub-block ranging from a next word line following the word line corresponding to the address to a last word line.

According to yet another aspect of the inventive concepts, a memory card is provided which includes a non-volatile memory device, a card interface, and a memory controller configured to control data communication of the card interface and the non-volatile memory device. The non-volatile memory device includes a memory cell array including a memory block which includes an NAND memory cell string connected to a plurality of word lines, and an access control part configured to receive an address, data, and a program command, program the data to a page defined by a word line corresponding to the address among the plurality of word lines, and then automatically erase a sub-block ranging from a next word line following the word line corresponding to the address to a last word line.

According to yet another aspect of the inventive concepts, a three-dimensional non-volatile memory device is provided which includes a plurality of memory cell arrays stacked in three dimensions, and an access control part configured to receive an address, data, and a program command, program the data to a page defined by a word line corresponding to the address among a plurality of word lines which are comprised in one of the memory cell arrays and are connected to an NAND memory cell string, and then automatically erase a sub-block ranging from a next word line following the word line corresponding to the address to a last word line.

BRIEF DESCRIPTION OF THE DRAWINGS

The above and other aspects and features of the inventive concepts will become readily apparent from the detailed description that follows, with reference to the accompanying drawings, in which:

FIG. 2A is a diagram of showing an example of sub-blocks of a two-dimensional memory block according to one or more embodiments of the inventive concepts;

FIG. 2B is a diagram of showing another example of sub-blocks of a two-dimensional memory block according to one or more embodiments of the inventive concepts;

FIG. 5C is a timing diagram for explaining the method of operating the non-volatile memory device illustrated in FIG. 1 according to one or more embodiments of the inventive concepts;

FIG. 6 is a diagram illustrating an operational sequence of a method of operating the non-volatile memory device illustrated in FIG. 1 according to one or more other embodiments of the inventive concepts;

FIG. 7C is a diagram illustrating an operational sequence of a method of operating the non-volatile memory device illustrated in FIG. 1 according to one or more other embodiments of the inventive concepts;

DETAILED DESCRIPTION OF THE EMBODIMENTS

Figure 1:
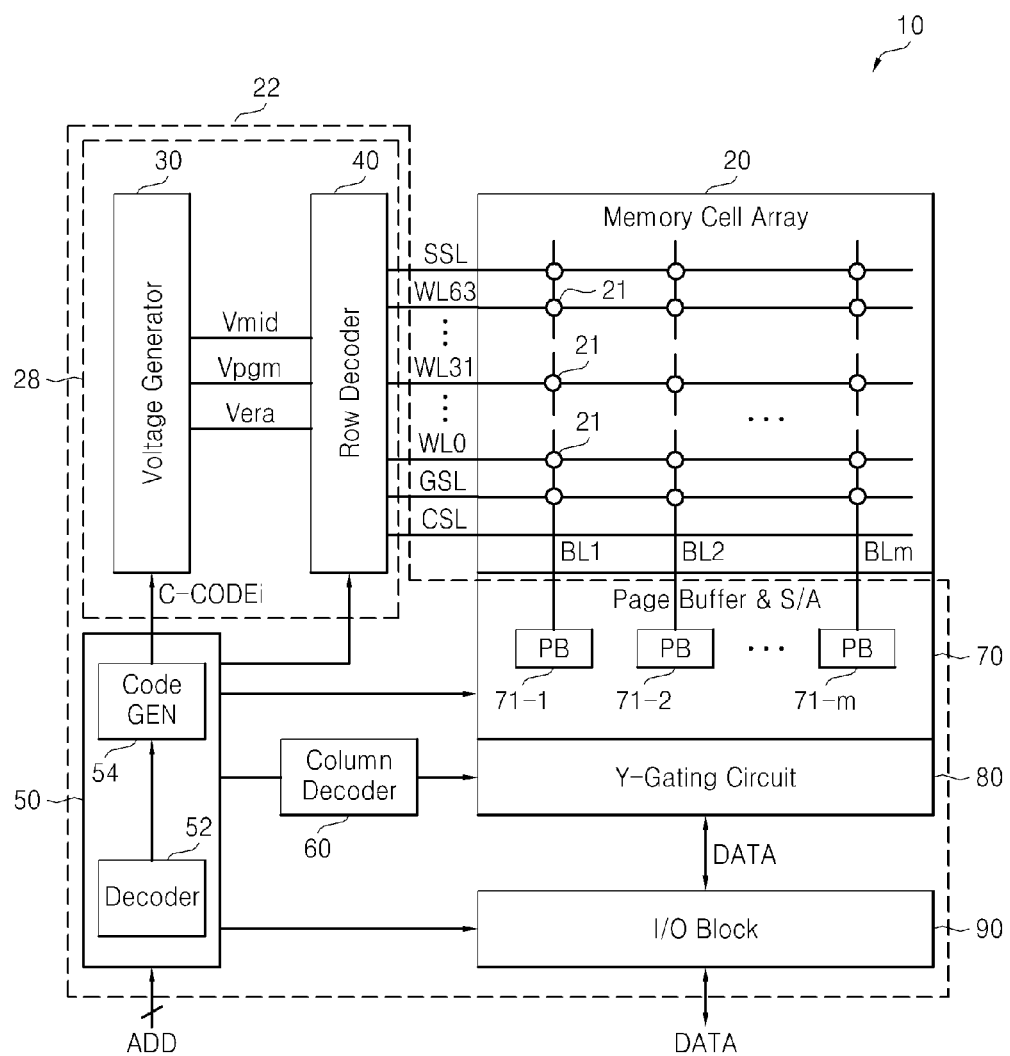
FIG. 1 is a block diagram of a non-volatile memory device according to one or more embodiments of the inventive concepts.

The inventive concepts now will be described more fully hereinafter with reference to the accompanying drawings, in which embodiments of the inventive concepts are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of elements and components may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As is customary in the field of the inventive concepts, elements of the embodiments may be described in terms of functional units illustrated in block diagram format. It will be well understood by those skilled in the art that these functional units are physically implemented by electronic circuits, with or without software-implemented control.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present disclosure, and will not be interpreted in an idealized or overly formal sense unless expressly so defined herein.

FIG. 1 is a block diagram of a non-volatile memory device 10 according to one or more embodiments of the inventive concepts. The non-volatile memory device 10 generally includes a memory cell array 20 and an access control unit 22.

The access control unit 22 of this example includes a voltage supply circuit 28, a control logic 50, a column decoder 60, a page buffer & sense amplifier (S/A) block 70, a Y-gating circuit 80, and an input/output (I/O) block 90. The voltage supply circuit 28 of this example includes a voltage generator 30 and a row decoder 40, and the control logic 50 of this example includes a decoder 52 and a code generator 54. Operational examples of the access control unit 22 will be described later herein in the context of embodiments of the inventive concepts.

Non-limiting examples of the memory cell array 20 will be described next with reference to FIGS. 2A, 2B and 3.

Referring to the examples of FIGS. 2A and 2B, a memory block MB of the memory cell array 20 includes a plurality "m" of NAND memory cell strings 20-1, 20-2, ..., 20-$m$, where "m" is a natural number. In these particular examples, the NAND memory cell strings 20-1 through 20-$m$ are laid out or embodied in a single plane or layer.

Each of the NAND memory cell strings 20-1 through 20-$m$ includes a plurality of non-volatile memory cells 21 connected in series. For example, the NAND memory cell string 20-1 includes a plurality of non-volatile memory cells 21 connected in series between a first selection transistor (or a string selection transistor) ST1 connected to the bit line BL1 and a second selection transistor (or a ground selection transistor) ST2 connected to a common source line CSL. A gate of the first selection transistor ST1 is connected to a string selection line SSL, and a gate of the second selection transistor ST2 is connected to a ground selection line GSL. Gates of the respective non-volatile memory cells 21 are connected to a plurality of word lines WL0 through WL63, respectively. The NAND memory cell strings 20-2 through 20-$m$ have the same or substantially the same structure as the NAND memory cell string 20-1.

In the examples of FIGS. 2A and 2B, 64 word lines WL0 through WL63 are illustrated. However, it will understood that the inventive concepts are not limited by the number of word lines The non-volatile memory cells 21 included in the NAND memory cell strings 20-1 through 20-$m$ may be implemented using flash electrically erasable programmable read-only memory (EEPROM) cells which are capable of storing one or more bits in each cell. In other words, each non-volatile memory cell 21 may be embodied by an NAND flash memory cell storing one bit (SLC) or multiple bits (MLC).

When the memory cells of the memory block are SLC, the memory cells of the memory strings connected to a same word line store one addressable page of data. On the other hand, when the memory cells of the memory block are MLC, the memory cells of the memory strings connected to a same word line store multiple addressable pages of data. For example, in the case of 2-bit MLC, each word lines would include two addressable pages of data, i.e., a least-significant bit (LSB) page and most-significant bit (MSB) page.

Figure 3:
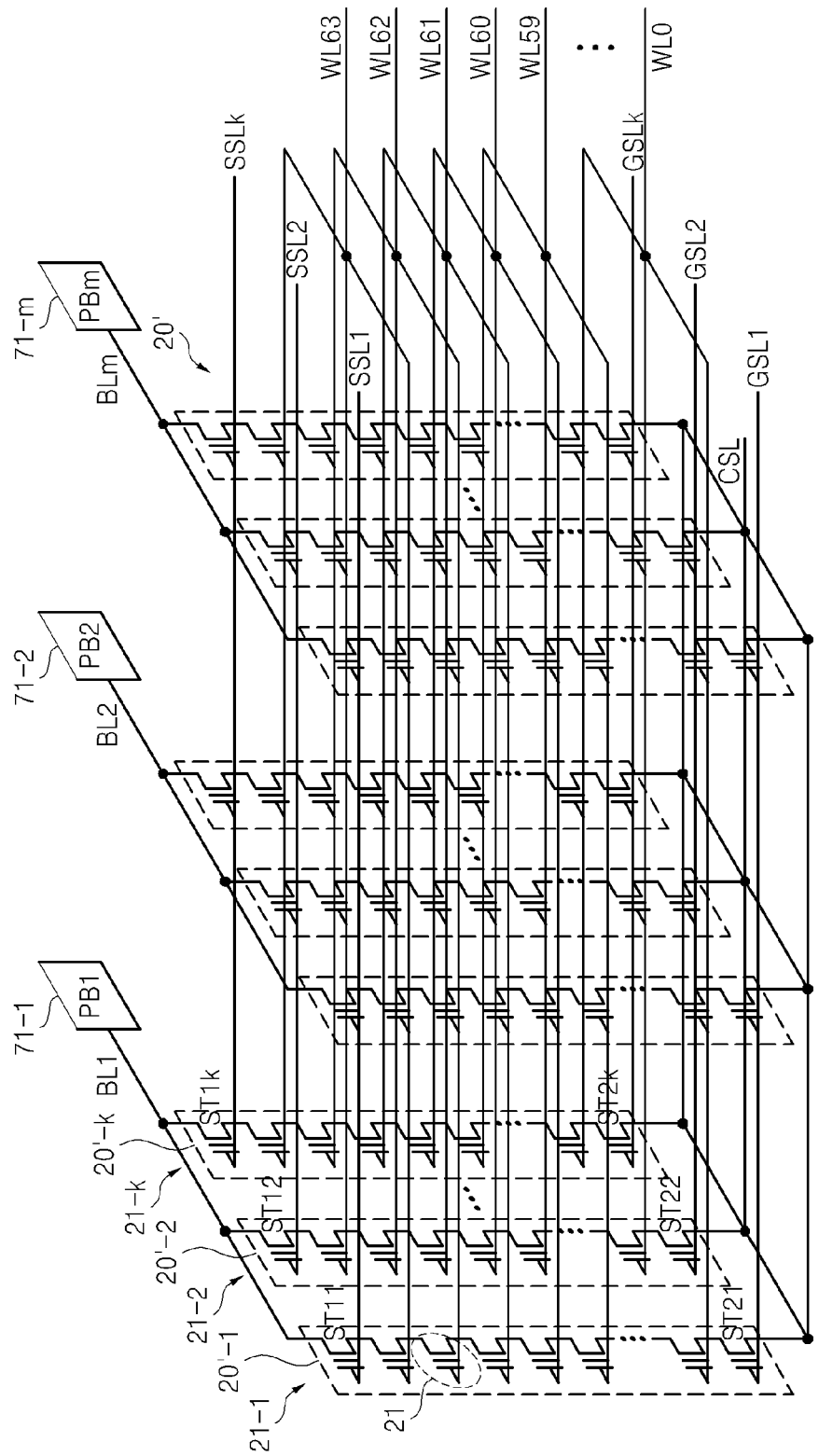
FIG. 3 is a diagram of showing an example of a three-dimensional memory block according to one or more embodiment of the inventive concepts.

FIG. 3 illustrates another example of the memory cell array 20 shown in FIG. 1. Here, memory cell strings 20'-1, 20'-2, . . . , 20'-k (where "k" is a natural number) are laid out in three dimensions on different planes or layers. The NAND memory cell strings 20'-1 through 20'-k of this example share an access control unit which accesses the NAND memory cell strings 20'-1 through 20'-k. As shown, the first NAND memory cell string 20'-1 may be laid out in a first layer 21-1, the second NAND memory cell string 20'-2 may be laid out in a second layer 21-2, and the k-th NAND memory cell string 20'-k may be laid out on a k-th layer 21-k.

The layers 21-1 through 21-k may, for example, be formed of a wafer stack, a chip stack, or a cell stack. The layers 21-1 through 21-k may be connected to one another using a conductive through element(s) such as a through-silicon via (TSV), a conductive bump, or wire bonding.

Each of the layers 21-1 through 21-k include a plurality of cell strings. For example, the first NAND memory cell string 20'-1 of the first layer 21-1 includes a plurality of non-volatile memory cells 21, e.g., NAND flash memory cells, connected in series between a plurality of selection transistors ST11 and ST21. The second NAND memory cell string 20'-2 of the second layer 21-2 includes a plurality of non-volatile memory cells 21, e.g., NAND flash memory cells, connected in series between a plurality of selection transistors ST12 and ST22. The k-th NAND memory cell string 20'-k of the k-th layer 21-k includes a plurality of non-volatile memory cells 21, e.g., NAND flash memory cells, connected in series between a plurality of selection transistors ST1k and ST2k.

As shown in the example of FIG. 3, each of the NAND memory cell strings 20'-1 through 20'-k share word lines WL0 through WL63, a common source line CSL, and a bit line BL1. In other words, each of the NAND memory cell strings at corresponding positions in the respective layers 21-1 through 21-k may be connected to a corresponding one among page buffers 71-1 through 71-m (PB1 through PBm) included in a page buffer and sense amplifier (S/A) block 70 (FIG. 1).

An exemplary three-dimensional (3D) non-volatile memory device is disclosed in U.S. Pat. No. 7,679,133, the disclosure of which is incorporated herein by reference.

Operational embodiments of the inventive concepts will now be described with reference to FIGS. 1 and 2A. In the example of FIG. 2A, the memory block MB includes a first sub-block SB1 and a second sub-block SB2, where each sub-block includes at least one word line. In this illustrated example, the first sub-block SB1 includes word lines WL0 through WL31, and the second sub-block SB2 includes word lines WL32 through WL63. It will be understood, however, that the inventive concepts are not limited to the configuration of FIG. 2A The access control unit 22 accesses the memory cell array 20 to perform a data access operation in response to a command (or command sets) and externally received addresses. The address may be received, for example, from an external memory controller. The data access operation may be a program operation, a read operation, or an erase operation. It will be understood that the program operation includes a program verify operation, and the erase operation includes an erase verify operation.

As will be explained next by way of example with reference to FIGS. 1 through 5B, a method of programming a memory block of a non-volatile memory device according to embodiments of the inventive concepts includes programming a first sub-block of a memory block, determining in the non-volatile memory device when a reference word line is programmed during programming of the first sub-block, and partial erasing a second sub-block of the memory block upon determining that the reference word line is programmed during programming of the first sub-block. In the example that follows, the reference word line is word line WL31.

For example, referring to FIGS. 1 and 2A, when a programming operation is to be executed, the access control unit 22 receives an address, data, and a program command from a memory controller, and programming is sequentially carried out beginning with the first word line WL01 of the memory block MB. In the example of FIG. 2A, the word line WL31 is designated as the reference word line, and is the last of the sequentially programmed word lines WL of the sub-block SB1.

Assume that the program address received by the access control unit 22 identifies the reference word line WL31. In this case, the access control unit 22 executes both a programming operation and a partial erase operation. Namely, the access control unit 22 is responsive to the program command to program the word line WL31 as identified by the received address, and to then execute a partial erase operation in which the non-programmed word lines WL32 through WL63 are erased. As will be explained later, in the case of MLC, the word line WL31 may be partially programmed (e.g., LSB page programmed) before execution of the partial erase operation, and then fully programmed (e.g., MSB page programmed) after the partial erase operation.

Herein, a "partial erase" operation refers to an erase operation in which less than all the word lines WL of a memory block are erased. This is contrast to a normal erase operation in which all the word lines WL of a memory block are erased. In this respect, reference is made to the exemplary bias conditions illustrated in the table below:

TABLE

|  | Normal Erase | Partial Erase |
| --- | --- | --- |
| Bit Lines (BL) | Floating | Floating |
| SSL | Floating | Floating |
| Selected WL | First WL voltage | Second WL voltage |
| Unselected WL | n/a | Floating |
| GSL | Floating | Floating |
| CSL | Floating | Floating |
| Substrate | First high erase voltage | Second high erase voltage |

In the example given in the table, in a normal erase operation, the bit lines, SSL, GSL and CSL are all electrically floating, the substrate voltage is biased to a first high erase voltage such as 20V, and the word lines are biased to a first voltage such as 0V. Since the entire block is being erased, there are no "unselected" word lines in a normal erase operation. Also, it will be understood that the substrate voltage may be applied to a semiconductor bulk of the memory cell array, e.g., pocket P-well and a deep N-well.

In the example given in the table, in a partial erase operation, unselected word lines WL (e.g., word lines of the sub-block SB1 of FIG. 2A) are electrically floating, together with the bit lines, SSL, GSL and CSL. In another example, unselected word lines WL (e.g., word lines of the sub-block SB1 of FIG. 2A) may be applied with a high voltage such as a high erase voltage applied to the substrate. The substrate voltage is biased to a second high erase voltage, and the selected word lines (e.g., word lines of the sub-block SB2 of FIG. 2A) are biased to a second WL voltage.

In the partial erase operation, by electrically floating the unselected word lines WL (e.g., word lines of the sub-block SB1 of FIG. 2A), or by applying a high voltage to the unselected word lines WL, F-N tunneling is not induced and the data previously stored is not erased.

The first WL voltage may be the same as or different than the second WL voltage, and the first high erase voltage may be the same as or different than the second high erase voltage. For example, the first and second WL voltages may both be 0V, and the first and second high erase voltages may both be 20V. However, the embodiments are not limited to these specific voltage examples.

Significantly, the voltage differential between the selected word lines WL and the substrate in the partial erase operation may be less than the voltage differential between the selected word lines and the substrate in the normal erase operation. This is because less voltage differential is necessary in the partial erase operation since the word lines being erased are already in an "erased" state. The use of a lower voltage differential may lessen the incidence of an over-erase condition that can result from higher voltage differentials between the word lines WL and substrate. Accordingly, for example, the second WL voltage for the partial erase operation may be more than the first WL voltage for the normal erase operation, and/or the second high erase (substrate) voltage for the partial erase operation may be less than the first high erase (substrate) voltage for the normal erase operation.

In the example of FIG. 2A, the partial erase of the word lines WL32 through WL63 is effective to "reset" the voltage distributions of the erased cells prior to programming of the word lines WL32 through WL63. In particular, during sequential programming of the word lines of the memory block MB, the erased cells of the "upper" word lines (e.g., the word lines WL of sub-block SB2) are especially susceptible to threshold voltage shifts caused by application of pass voltages to non-selected word lines during programming of the "lower" word lines (e.g., the word lines WL of sub-block SB1). This is referred to here as "Vpass disturb." The shift in the voltage distributions of the erased cells can deteriorate a threshold voltage distribution window between the erased cells and programmed cells upon completion of the programming of the memory block MB.

Figure 4:
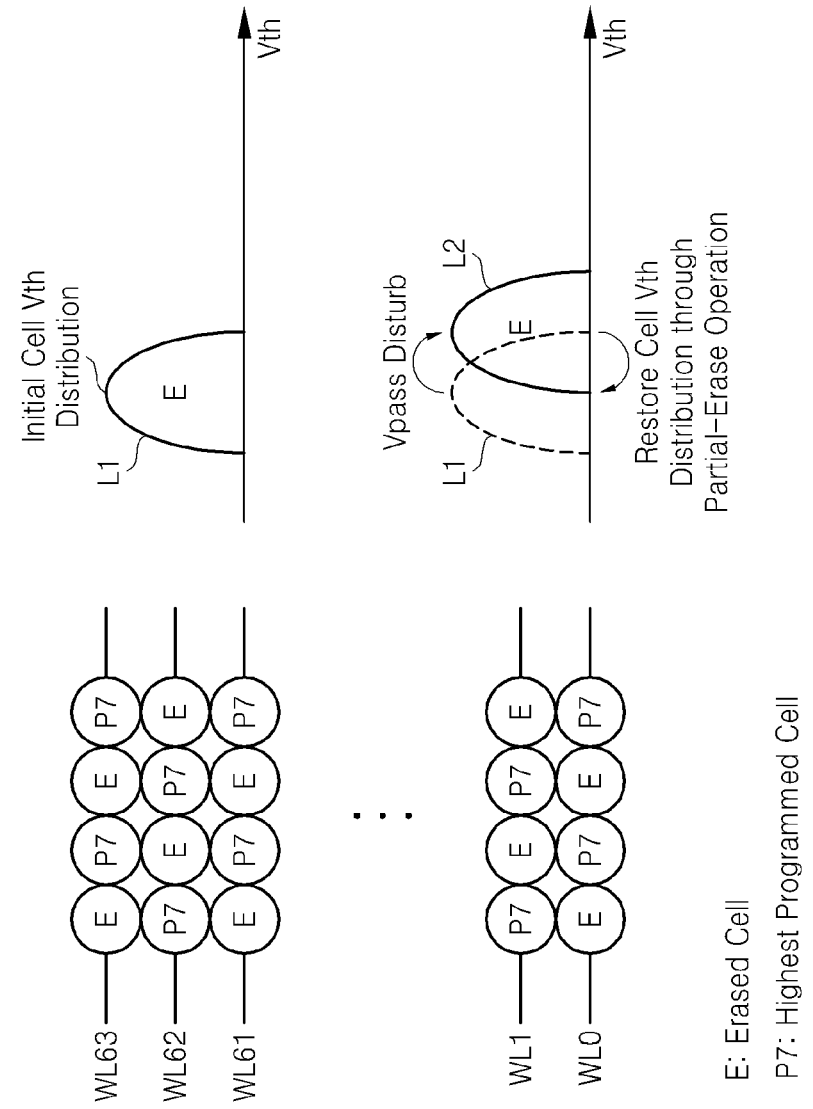
FIG. 4 is a diagram for explaining a disturbance in the threshold voltage distribution of non-volatile memory cells caused by a pass voltage during a program operation, and further explaining a recovery of the threshold voltage distribution using a partial-erase operation.

For example, reference is made to FIG. 4 which is a diagram for explaining an example of a disturbance in a threshold voltage distribution caused by application of pass voltages during sequential programming of word lines WL. In the illustrated example, a memory block MB includes 64 word lines, i.e., WL0 through WL63. Four memory cells are shown as being connected to each word line. Also in this example, the NAND memory cells each store 3-bit data, where "E" denotes an NAND memory cell in an erased state, and "P7" denotes an NAND memory cell having the highest threshold voltage in a programmed state.

The distribution curve L1 denotes an initial threshold voltage (Vth) distribution of erased cells E connected to the word line WL63 prior to execution of the programming operation of the memory block MB. The distribution curve L2 denotes a Vth distribution of erased cells E connected to the word line WL63 after a program operation is performed on a lower word line, e.g., the word line WL31. It can be seen that Vpass disturb causes the voltage distribution of the erased cells of the word line WL63 to shift in a positive voltage direction. Application of the partial erase operation on the word line WL63 causes the voltage distribution of the erased cells of the word line WL63 to revert back to, or substantially revert back to, the original Vth distribution curve L1. In this manner, a suitable threshold voltage distribution window between the erased cells and programmed cells upon completion of the programming of the memory block MB is preserved.

In the case of SLC programming, in the example of the current embodiments, the partial erase operation of the second sub-block SB2 of FIG. 2A is executed after single-bit programming of the reference word line WL31.

As mentioned above, however, in the case of MLC programming, the word line WL31 may be partially programmed (e.g., LSB page programmed) before execution of the partial erase operation, and then fully programmed (e.g., MSB page programmed) after the partial erase operation. With an increase in the number of data bits stored in each memory cell, it is increasingly difficult to secure reliability of a memory device storing multi-bit (or, multi-level) data. On potential factor causing degradation in reliability may be unintended threshold voltages variations resulting from coupling between adjacent memory cells. For example, a threshold voltage of a previously programmed memory cell may be varied due to coupling when a memory cell adjacent to a programmed memory cell is programmed. In an effort to manage such coupling effects, techniques sometimes referred to as shadow programming and address scrambling have been developed. In this case, in the example of FIG. 2A, one or more lower bits (or pages) of the word line WL32 of the second sub-block SB2 may be programmed before one or more upper bits (or pages) of the word line WL31 of the first sub-block SB1. Thus, in order to avoid an erase of the programmed lower bits of the word line WL32, the partial erase of the second sub-block SB2 may be carried out after the lower-bit programming of the word line WL31. In other words, for example, the second sub-block SB2 may be partially erased after an LSB page is programmed in the reference word line WL31 and before an MSB page is programmed in the reference word line WL31. For purposes of definition, programming schemes in which at least one lower bit (LSB) of at least one upper word line WL is programmed before at least one upper bit (MSB) of at least one lower word line WL are collective referred to herein as shadow programming.

In the example of FIG. 2A, as described above, the reference word line is WL31, and the memory block MB includes two sub-blocks SB1 and SB2. The non-volatile memory device is responsive to a program command to automatically execute a program operation and a partial erase operation when a received program address corresponds to the reference word line WL31. Namely, at least one page of the reference word line WL31 is programmed, and a partial erase is performed on the second sub-block SB2. The embodiments, however, are not limited to the provision of two sub-blocks per memory block, nor are they limited to sub-blocks have a same number of word lines WL.

In the example illustrated in FIG. 2B, when the memory block MB includes three sub-blocks SB1, SB2, and SB3, where sub-block SB1 includes word lines WL0 through WL31, sub-block SB2 includes word lines WL32 and WL33, and sub-block SB3 includes word lines WL34 through WL63.

In the configuration of FIG. 2B, after all word lines WL0 through WL31 of the first sub-block SB1 are programmed, a partial erase operation may be carried out on the second and third sub-blocks SB2 and SB3 simultaneously. Alternatively, after all word lines WL0 through WL31 of the first sub-block SB1 are programmed, a partial erase operation may be carried out on the second sub-block SB2 only, and after the second sub block SB2 is programmed, a partial erase may be carried out the third sub-block SB3 only. As yet another alternative, after all word lines WL0 through WL31 of the first sub-block SB1 are programmed, a partial erase operation may be carried out on both the second sub-block SB2 and the third sub-block SB3, and after the second sub block SB2 is programmed, a partial erase may be carried out the third sub-block SB3 only.

In another alternative associated with the configuration of FIG. 2B, an intermediate voltage is applied to the word lines WL32 and WL33 during a partial erase operation executed after programming of the last word line (WL31) of the first sub-block WL31. For example, the intermediate voltage Vmid may be a voltage between the substrate voltage and the word line WL voltage applied (e.g., 0V) to the word lines WL of the third sub-block SB3 during the partial erase operation. In the case where the word line WL voltage of the third sub-block is 0V, and the substrate erase voltage is 15 to 20V, the intermediate voltage Vmid may, for example, be in the range of 5 to 8 V. However, the intermediate voltage is not limited to this specific voltage range. Application of the intermediate voltage Vmid during the partial erase operation may be effective to reduce a threshold disturbance to the lower word lines WL (i.e., the word lines of the sub-block SB1) during the partial erase operation.

The inventive concepts are also applicable to the three-dimensional configuration illustrated by way of example in FIG. 3. In this case, for example, the shared word line WL31 may be designated as the reference word line, in which case the memory cells of the shared word lines WL0 through WL31 constitute a first sub-block, and the shared word lines WL0 through WL32 constitute a second sub-block. As with the previous examples, the non-volatile memory device 10 responsive to an externally program command to execute both a program operation and a partial erase operation (e.g., of the second sub-block) when a program address corresponds to the reference word line WL31.

The non-volatile memory device 10 may sequentially perform the program operation on a word line and a partial-erase operation of erasing a next sub-block in response to a single program command. Alternatively, the non-volatile memory device 10 may sequentially receive a program command and a sub-block erase command from an external device. At this time, the sub-block erase command may include an address indicating a next word line coming after a word line subjected to the program command.

In the examples given above, the reference word line WL is roughly in a center region of the sequentially arranged word lines WL of the memory block MB. However, the embodiments are not limited in this respect. Further, selection of the reference word line WL may be carried out experimentally, i.e., by trial and error testing of the non-volatile memory device. Once the reference word line WL is determined, the address thereof may be stored in an information memory block and/or an e-fuse of the non-volatile memory device 10.

As mentioned previous, the access control unit 22 of the example of FIG. 1 includes a voltage supply circuit 28, a control logic 50, a column decoder 60, the page buffer and S/A block 70, a Y-gating circuit 80, and an input/output (I/O) block 90. An exemplary operation of these components will now be described in the context of embodiments of the inventive concepts.

When the memory cell array 20 has a configuration such as that illustrated in FIG. 2A and the input word line (or page) address (ADD) is the same as the reference word line WL (or page) address, the voltage supply circuit 28 generates a program voltage Vpgm to be applied to the word line WL31 in response to a first control code C-CODEi (where "i" is 1) from the control logic 50. After the program operation on the word line WL31 is completed (i.e., after successful completion of program execution and program verify operations), the voltage supply circuit 28 establishes the partial erase bias conditions of the TABLE presented previously in response to a second control code C-CODEi (where "i" is 2). In the present embodiments, the first control code C-CODE1 and the second control code C-CODE2 are sequentially and automatically generated by the control logic 50, i.e., no externally received erase command is needed. In other words, the control logic 50 is responsive to an externally received program command to sequentially generate the first control code C-CODE1 and the second control code C-CODE2 when the input word line (or page) address (ADD) is the same as the reference word line WL (or page) address.

When the memory cell array 20 has a configuration such as that illustrated in FIG. 2A and the input word line (or page) address (ADD) is the same as the reference word line WL (or page) address, the voltage supply circuit 28 generates a program voltage Vpgm to be applied to the word line WL31 in response to a first control code C-CODEi (where "i" is 1) from the control logic 50. After the program operation on the word line WL31 is completed (i.e., after successful completion of program execution and program verify operations), the voltage supply circuit 28 establishes the partial erase bias conditions of the TABLE presented previously in response to a third control code C-CODEi (where "i" is 3), except that the word lines WL32 and WL33 are established at the intermediate voltage Vmid described previously. Again, in the present embodiments, the first control code C-CODE1 and the third control code C-CODE3 are sequentially and automatically generated by the control logic 50, i.e., no externally received erase command is needed.

The voltage supply circuit 28 includes the voltage generator 30 and the row decoder 40. The voltage generator 30 generates various voltages needed for the programming operations of the embodiment, such as a program voltage Vpgm, an erase voltage Vera, the intermediate voltage Vmid, and so on. The row decoder 40 selectively applies the generated voltages to word lines WL and/or substrate bulk under control of the control logic 50. It is noted here that the program voltage Vpgm may be generated using an incremental step pulse program (ISPP) scheme, and that the erase voltage Vera may be generated using an incremental step pulse erase (ISPE) scheme.

The control logic 50 controls the overall operation of the access control unit 22, and includes a decoder 52 and a code generator 54. The decoder 52 compares an input address (i.e., an address output from a memory controller) with a predetermined reference address, and the code generator generates an appropriate control code C-CODEi according to a comparison result.

For instance, when the memory cell array 20 is configured as in FIG. 2A and the input address is the same as the reference word line WL address, the control logic 50 automatically and sequentially generates the first control code C-CODE1 and the second control code C-CODE2 as discussed above. On the other hand, when the input address is not the same as the reference word line WL address, the control logic 50 generates only the first control code C-CODE1, and the voltage supply circuit 28 is responsive thereto apply the program voltage Vpgm to a selected word line (e.g., one among the word lines WL0 through WL30) corresponding to the input address.

When the memory cell array 20 is configured as in FIG. 2B and the input address is the same as the reference word line WL address, the control logic 50 automatically and sequentially generates the first control code C-CODE1 and the third control code C-CODE3 as discussed above. On the other hand, when the input address is not the same as the reference word line WL address, the control logic 50 generates only the first control code C-CODE1, and the voltage supply circuit 28 is responsive thereto apply the program voltage Vpgm to a selected word line (e.g., one among the word lines WL0 through WL30) corresponding to the input address.

The decoder 52 may also be used to generate controls signals applied to the voltage supply circuit. For example, when the input address is the same as the reference word line WL address, the decoder 52 may output a first control signal to the code generator 54 and send a second control signal to the row decoder 40 so that an appropriate voltage (e.g., 0V) can be applied to the word lines WL32 through WL63 during partial erase of the second sub-block SB2 illustrated in FIG. 2A. As another example, when the input address is the same as the reference word line WL address, the decoder 52 may output a control signal to the code generator 54 and send a second control signal to the row decoder 40 so that the intermediate voltage can be applied to the word lines WL32 and WL33 and an appropriate voltage (e.g., 0V) can be applied to the word lines WL32 through WL63 during partial erase of the third sub-block SB3 illustrated in FIG. 2B.

The column decoder 60 is controlled by the control logic 50 to decode column addresses and output a plurality of corresponding selection signals to the Y-gating circuit 80.

The page buffer and S/A block 70 includes a plurality of page buffers 71-1 through 71-m respectively connected to a plurality of bit lines BL1 through BLm. Each of the page buffers 71-1 through 71-m may function as a write driver, which programs page data to the memory cell array 20, during a program operation under control of the control logic 50. In addition, each of the page buffers 71-1 through 71-m may function as a sense amplifier (S/A), which senses and amplifies a voltage level of a corresponding one of the bit lines BL1 through BLm during a read operation or a verify operation under control of the control logic 50.

The Y-gating circuit 80 controls exchange of data between the page buffer and S/A block 70 and the I/O block 90 in response to the selection signals output from the column decoder 60.

The I/O block 90 transmits data received from an external device to the Y-gating circuit 80 or transmit data output from the Y-gating circuit 80 to the external device through a plurality of I/O pins or a data bus. The I/O pins may receive addresses such as program addresses, read addresses, or erase addresses, commands such as a program command, a read command, or an erase command, and data. In addition, the I/O pins may transmit data to an external device in response to the read command. The addresses include column addresses and row addresses.

Figure 5A:
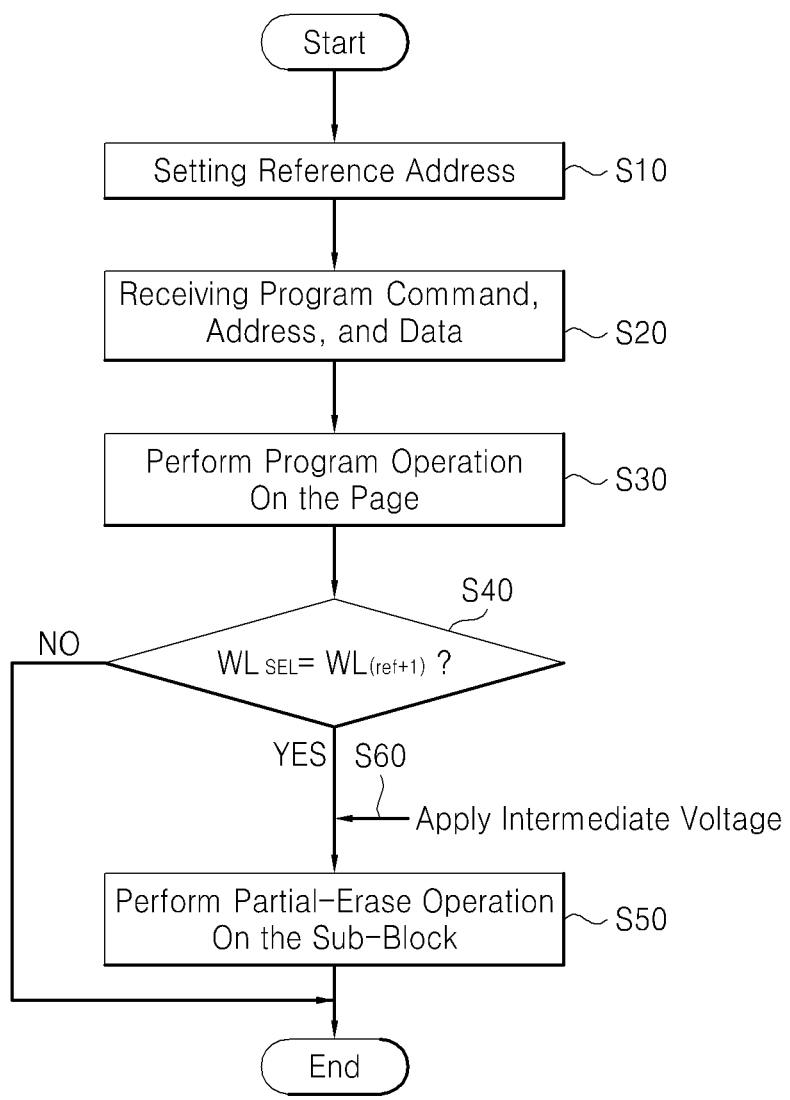
FIG. 5A is a flowchart for explaining a method of operating the non-volatile memory device illustrated in FIG. 1 according to one or more embodiments of the inventive concepts.
Figure 5B:
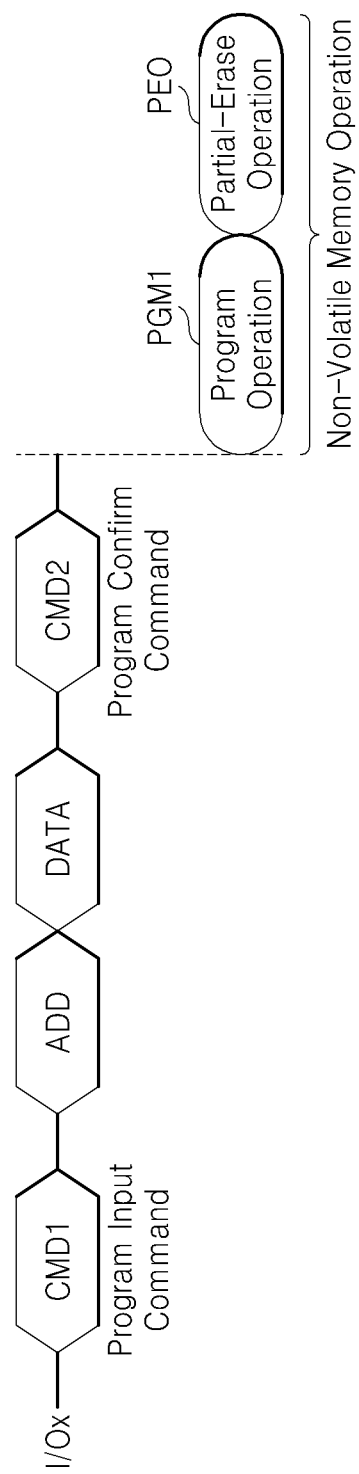
FIG. 5B is a diagram showing a command sequence and non-volatile memory device operation according to one or more embodiments of the inventive concepts.

FIG. 5A is a flowchart for use in further explaining an operation of the non-volatile memory device 10 illustrated in FIG. 1 according to embodiments of the inventive concepts. FIG. 5B is a diagram for use in explaining commands input through an I/O data bus and the operations of the non-volatile memory device 10 illustrated in FIG. according to embodiments of the inventive concepts. FIG. 5C is a timing diagram for use in further explaining an operation of the non-volatile memory device 10 illustrated in FIG. 1 according to embodiments of the inventive concepts. Referring collectively to these figures, an operation of embodiments of the inventive concepts will be described.

After the non-volatile memory device 10 is powered up, a reference address WLref is set in the decoder 52 in operation S10. The setting of the reference address WLref is carried out by executing an e-fuse read operation of the reference address WLref stored in an information block in a portion of the memory cell array 20 of the non-volatile memory device 10.

Thereafter, the non-volatile memory device 10 receives a program input command CMD1, an address ADD, data DATA, and a program confirm command CMD2 from an external device, e.g., a memory controller, through an I/O data bus in operation S20. FIGS. 5A and 5B illustrate that the signals CMD1, ADD, DATA and CMD1 as being sequentially received, but it is noted that two or more of these signal may instead be received in parallel.

Next, the non-volatile memory device 10 programs the data DATA to a page defined in the word line WL address ADD in response to the program confirm command CMD2 in operation S30 of FIG. 5A. This is illustrated as operation PGM1 in FIG. 5B. As noted previously, the program operation includes a program execution period and a verify period of a program verify operation.

After it is verified that all cells of the page have been successfully programmed, and in the case where the word line address corresponds to the reference address WLref as mentioned above (YES at operation S40), the non-volatile memory device 10 automatically executes a partial erase operation on a non-programmed sub-block (e.g., sub-block SB2 of FIG. 2A) of the memory block MB as discussed in connection with the embodiments previously described. This is represented as operation S50 in FIG. 5A, and illustrated as operation PEO in FIG. 5B.

Referring to FIG. 5C, while a chip enable signal /CE is active (low) and a command latch enable signal CLE is active (high), commands are input to the non-volatile memory device based on toggles of a write enable signal /WE. Likewise, addresses are input to the non-volatile memory device 10 when an address latch enable signal (ALE) is also active (high) based on toggles of a write enable signal /WE. Further, data is input into the non-volatile memory device when a data strobe signal DQS is toggled, and the input data is temporarily stored (e.g., in the pages buffers of the non-volatile memory device). It is noted that, in FIG. 5C, separate column address signal CADD and row address signal RADD are shown. In the illustrated example, the row address signal RADD identifies the reference word line WL (e.g., the word line WL31 in the examples given above).

Also shown in FIG. 5C is a ready/busy signal R&/B which is generated by the non-volatile memory device 10 to inform the external device (e.g., memory controller) when the non-volatile memory device is in a busy state. After receipt of the commands, address signals, and data, the non-volatile memory device executes the program and partial erase operations if the row address signal RADD included in the address signals identifies the reference word line WL. During these operations, the ready/busy signal R&/B is in a "busy" state. In FIG. 5C, "tPROG" denotes the time elapsed to execute the program operation of the reference word line WL, and "tERS" denotes the time elapsed to execute the partial erase operation (e.g., the partial erase of the sub-block SB2 of FIG. 2A).

Reference now made to FIG. 6 for further explanation of communication between the memory controller and non-volatile memory device (NAND) according to embodiments of the inventive concepts.

Initially, at operation S610, the reference word line (or page) address Wref is set in the non-volatile memory device. As described above, this may be carried out, for example, by execution of an e-fuse read operation upon power-up of the non-volatile memory device.

In the case where programming of a memory block MB of the non-volatile memory device is to be carried out, the controller begins sequential programming of the word lines WL of the non-volatile memory device. As discussed above, the programming may be SLC programming and/or MLC programming. During this sequential programming, the memory controller eventually issues a program address corresponding to the reference address Wref at operation S620 of FIG. 6.

As described in the embodiments above, when the program address corresponds to the reference address Wref, operation S630 is carried out in which the non-volatile memory programs the page designated by the reference address Wref, and executes a partial erase operation of at least some of the non-programmed word lines WL remaining in the memory block MB. During this time (tPROG+tERS), at operation S640, the ready/busy signal R&/B is driven to a "low" state, i.e., a "busy" state.

In operation S650 of FIG. 6, the memory controller monitors the ready/busy signal R&/B, and delay issuance of further program commands while the ready/busy signal R&/B is in a "busy" state. As shown in the figure, the memory controller may issue a status read command, and the non-volatile memory device may be responsive thereto to output status data an operation S660.

At the termination of the time period tPROG+TERS, the ready/busy signal R&/B is set to a "high" state, i.e., a "ready" state, and the controller at operation S670 issues programming commands associated with the next word line of the memory block, e.g., the page address Wref+1.

In the embodiments described above, the partial erase operation is carried out by the non-volatile memory device in the absence of a received partial erase command from the memory controller. That is, the non-volatile memory device itself executes a comparison between a reference address Wref and a program address ADD received from the memory controller, and automatically carries out the partial erase operation when the reference address Wref coincides with the program address ADD. However, as described next with reference to FIG. 7A through 7C, the inventive concepts are not limited in this manner.

Figure 7A:
FIG. 7A is a diagram showing a command sequence according to one or more other embodiments of the inventive concepts.
Figure 7B:
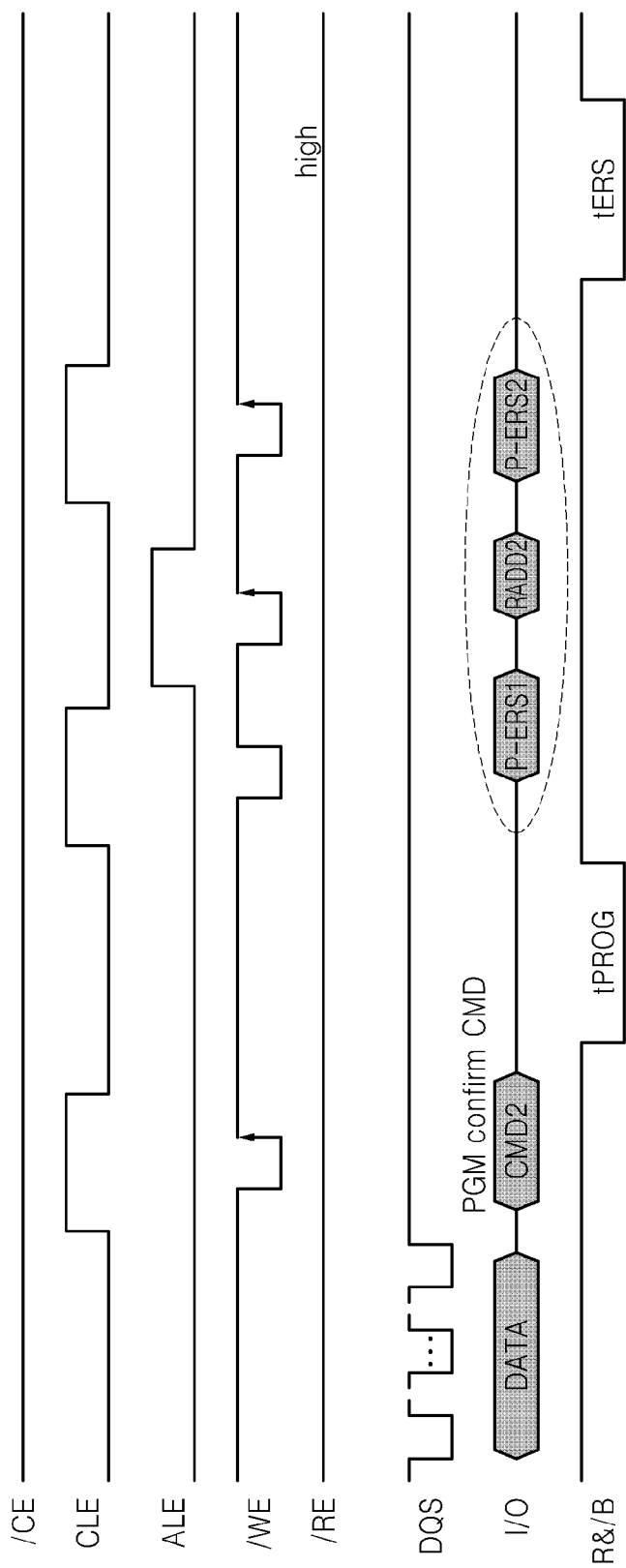
FIG. 7B is a timing diagram for explaining the method of operating the non-volatile memory device illustrated in FIG. 1 according to one or more other embodiments of the inventive concepts.

FIG. 7A is a diagram for use in explaining commands input through an I/O data bus and the operations of a non-volatile memory device according to further embodiments of the inventive concepts. FIG. 7B is a timing diagram for use in further explaining an operation of a non-volatile memory device 10 according to the further embodiments of the inventive concepts.

Referring first to FIG. 7A, the non-volatile memory device receives a program input command CMD1, an address (CADD and RADD1), data DATA, and a program confirm command CMD2 from an external device, e.g., a memory controller, through an I/O data bus. FIG. 7A illustrate that the signals CMD1, (CADD and RADD1), DATA and CMD1 as being sequentially received, but it is noted that two or more of these signals may instead be received in parallel.

Next, the non-volatile memory device programs the data DATA to a page defined in the row address RADD1 in response to the program confirm command CMD2. As noted previously, the program operation includes a program execution period and a verify period of a program verify operation. During this time, the read/busy signal R&/B is driven to a busy state.

It is assumed in FIG. 7A that the row address RADD1 corresponds to the reference address Wref discussed previously. After it is verified that all cells of the reference page have been successfully programmed, the read/busy signal R&/B is set to a ready state, and the non-volatile memory device receives partial erase input command P-ERS1, a row address RADD2, and a partial erase confirm command P-ERS2. Again, these signals may be received sequentially and/or in parallel. In response, with reference to the row address RADD2, the non-volatile memory device executes a partial erase of upper word lines of the memory block as described in connection with previous embodiments. The row address RADD2 may correspond to or may be different from the word lines address WLref+1. During the partial erase period, the read/busy signal R&/B is driven to a busy state.

FIG. 7B corresponds to the operation of FIG. 7A and is similar to previously described 5C, except that FIG. 7B shows separate execution of the program operation and the partial erase operation. Namely, receipt of the partial erase input command P-ERS1, the row address RADD2, and the partial erase confirm command P-ERS2 occurs after the programming operation of time period tPROG and before the partial erase operation of time period tERS.

Reference now made to FIG. 7C for further explanation of communication between the memory controller and non-volatile memory device (NAND) according to other embodiments of the inventive concepts.

Initially, at operation S710, the reference word line (or page) address Wref is set in the non-volatile memory device. As described above, this may be carried out, for example, by execution of an e-fuse read operation upon power-up of the non-volatile memory device.

As operation S720, the memory controller reads the reference address Wref set in the non-volatile memory device.

In the case where programming of a memory block MB of the non-volatile memory device is to be carried out, the controller begins sequential programming of the word lines WL of the memory block MB non-volatile memory device. As discussed above, the programming may be SLC programming and/or MLC programming. During this sequential programming, the memory controller eventually issues a program address corresponding to the reference address Wref at operation S730 of FIG. 7C.

As described in the embodiments above, when the program address corresponds to the reference address Wref, operation S740 is carried out in which the non-volatile memory programs the page designated by the reference address Wref. During this time (tPROG), at operation S750, the ready/busy signal R&/B is driven to a "low" state, i.e., a "busy" state.

In operation S760 of FIG. 7C, the memory controller monitors the ready/busy signal R&/B, and delay issuance of further program commands while the ready/busy signal R&/B is in a "busy" state. As shown in the figure, the memory controller may issue a status read command, and the non-volatile memory device may be responsive thereto to output status data a operation S770.

At the termination of the time period tPROG, the ready/busy signal R&/B is set to a "high" state, i.e., a "ready" state, and the controller at operation S780 issues a partial erase command with an partial erase address corresponding to Wref+1.

In operation S790, the non-volatile memory device is responsive to the partial erase command from the memory controller to execute a partial erase operation of at least some of the non-programmed word lines WL remaining in the memory block MB, including, in this example, the word line corresponding to Wref+1. During this time (tERS), the ready/busy signal R&/B is driven to a "low" state, i.e., a "busy" state.

In operation S800 of FIG. 7C, the memory controller monitors the ready/busy signal R&/B, and delays issuance of further program commands while the ready/busy signal R&/B is in a "busy" state. As shown in the figure, the memory controller may issue a status read command as discussed previously.

At the termination of the time period tERS, the ready/busy signal R&/B is set to a "high" state, i.e., a "ready" state, and the controller at operation S8100 issues a program command with an program address corresponding to Wref+1. From this point, the sequential programming of the remaining word lines proceeds.

Figure 8:
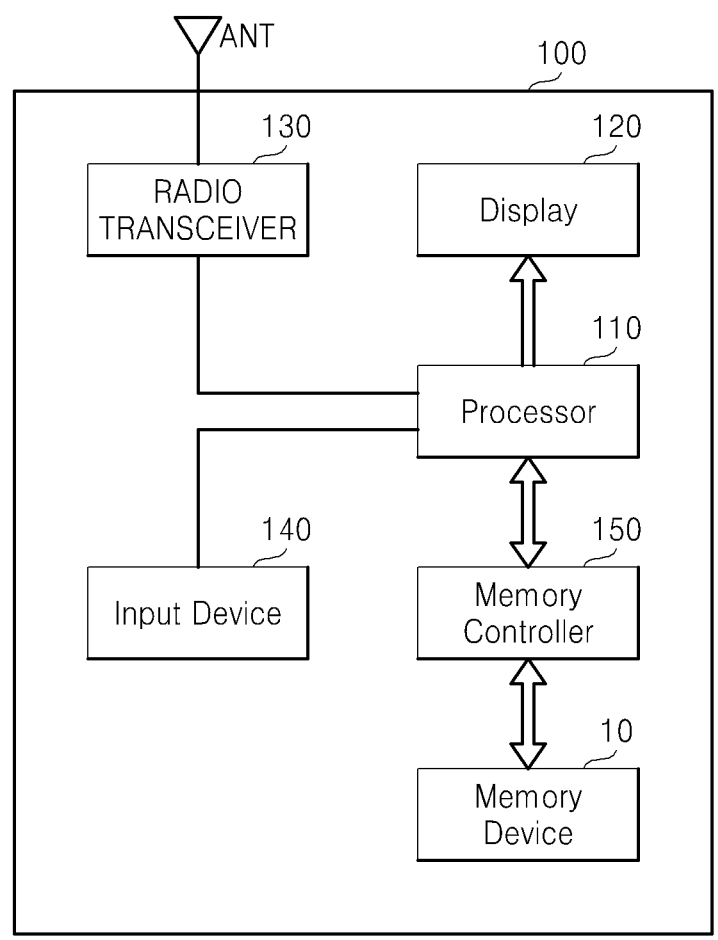
FIGS. 8 through 13 are block diagrams of respective memory systems which include a non-volatile memory device according to one or more embodiments of the inventive concepts.

FIG. 8 is a block diagram of a memory system 100 including the non-volatile memory device 10 illustrated in FIG. 1 according to some embodiments of the inventive concepts. The memory system 100 may be implemented as a cellular phone, a smart phone, a tablet personal computer (PC), a personal digital assistant (PDA) or a radio communication system.

The memory system 100 includes the non-volatile memory device 10 and a memory controller 150 controlling the operations of the non-volatile memory device 10. The memory controller 150 may control the data access operations, e.g., a program operation, an erase operation, and a read operation, of the non-volatile memory device 10 according to the control of a processor 110.

During a program operation, the non-volatile memory device 10 and memory controller 150 are configured according to any of the embodiments described previously herein. The page data programmed in the non-volatile memory device 10 may be displayed through a display 120 according to the control of the processor 110 and/or the memory controller 150.

A radio transceiver 130 transmits or receives radio signals through an antenna ANT. The radio transceiver 130 may convert radio signals received through the antenna ANT into signals that can be processed by the processor 110. Accordingly, the processor 110 may process the signals output from the radio transceiver 130 and transmit the processed signals to the memory controller 150 or the display 120. The memory controller 150 may program the signals processed by the processor 110 to the non-volatile memory device 10. The radio transceiver 130 may also convert signals output from the processor 110 into radio signals and outputs the radio signals to an external device through the antenna ANT.

An input device 140 enables control signals for controlling the operation of the processor 110 or data to be processed by the processor 110 to be input to the memory system 100. The input device 140 may be implemented by a pointing device such as a touch pad or a computer mouse, a keypad, or a keyboard.

The processor 110 may control the operation of the display 120 to display data output from the memory controller 150, data output from the radio transceiver 130, or data output from the input device 140. The memory controller 150, which controls the operations of the non-volatile memory device 10, may be implemented as a part of the processor 110 or as a separate chip.

Figure 9:
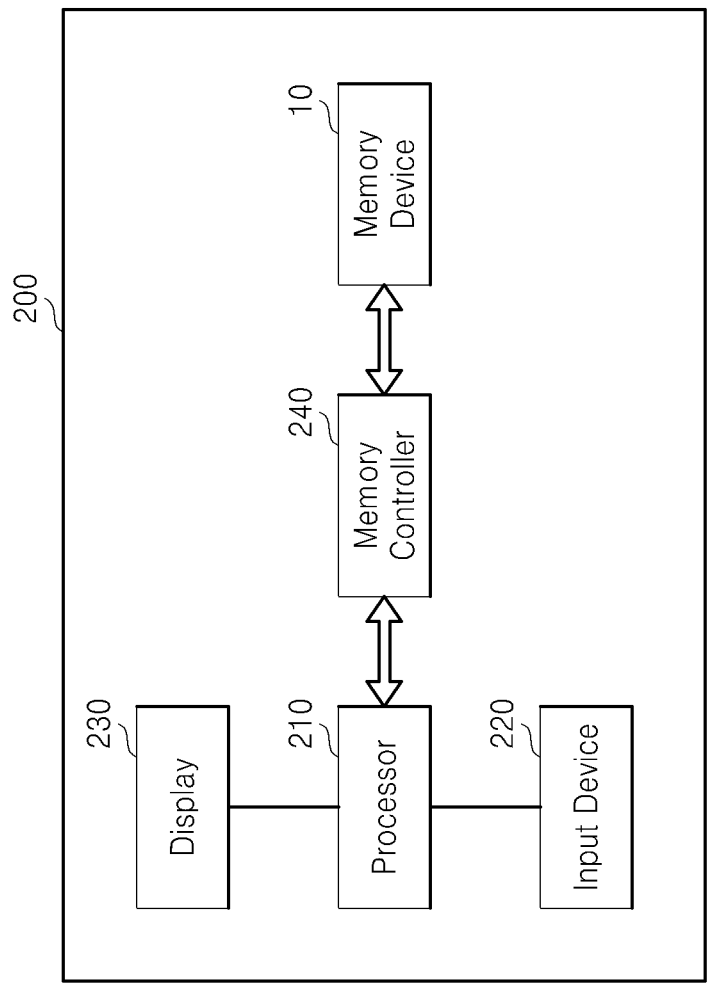

FIG. 9 is a block diagram of a memory system 200 including the non-volatile memory device 10 illustrated in FIG. 1 according to other embodiments of the inventive concepts. The memory system 200 may be implemented as a PC, a tablet PC, a netbook, an e-reader, a PDA, a portable multimedia player (PMP), an MP3 player, or an MP4 player.

The memory system 200 includes the non-volatile memory device 10 and a memory controller 240 controlling the data processing operations of the non-volatile memory device 10. The non-volatile memory device 10 and memory controller 240 are configured according to any of the embodiments described previously herein A processor 210 may display data stored in the non-volatile memory device 10 through a display 230 according to data input through an input device 220. The input device 220 may be implemented by a pointing device such as a touch pad or a computer mouse, a keypad, or a keyboard.

The processor 210 may control the overall operation of the memory system 200 and the operations of the memory controller 240. The memory controller 240, which may control the operations of the non-volatile memory device 10, may be implemented as a part of the processor 210 or as a separate chip.

Figure 10:
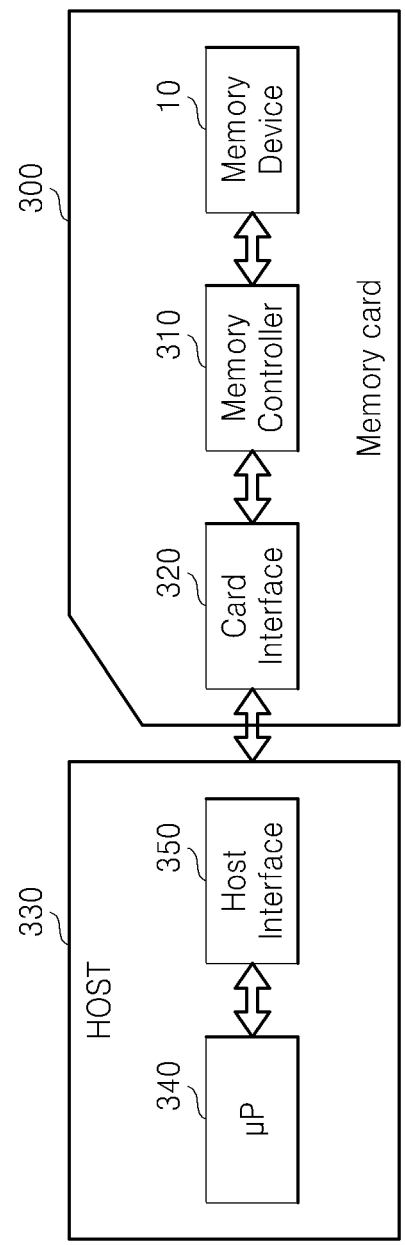

FIG. 10 is a block diagram of a memory system 300 including the non-volatile memory device 10 according to further embodiments of the inventive concepts. The memory system 300 may be implemented as a memory card or a smart card. The memory system 300 includes the non-volatile memory device 10, a memory controller 310, and a card interface 320. The non-volatile memory device 10 and memory controller 310 are configured according to any of the embodiments described previously herein.

The memory controller 310 may control data exchange between the non-volatile memory device 10 and the card interface 320. The card interface 320 may be a secure digital (SD) card interface or a multi-media card (MMC) interface, but the inventive concepts is not restricted to the current embodiments.

The card interface 320 may interface a host 330 and the memory controller 310 for data exchange according to a protocol of the host 330. The card interface 320 may support a universal serial bus (USB) protocol and an interchip (IC)-USB protocol. Here, the card interface 320 may indicate a hardware supporting a protocol used by the host 330, software installed in the hardware, or a signal transmission mode.

When the memory system 300 is connected with the host 330 such as a PC, a tablet PC, a digital camera, a digital audio player, a cellular phone, a console video game hardware, or a digital set-top box, a host interface 350 of the host 330 may perform data communication with the non-volatile memory device 10 through the card interface 320 and the memory controller 310 according to the control of a microprocessor 340.

Figure 11:
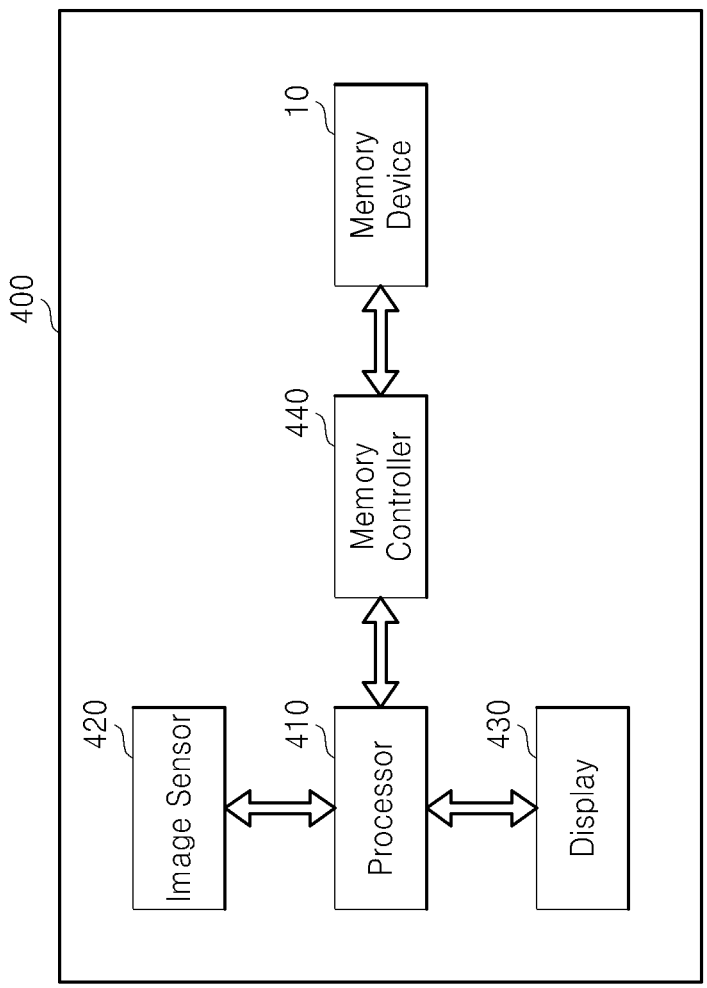

FIG. 11 is a block diagram of a memory system 400 including the non-volatile memory device 10 according to other embodiments of the inventive concepts. The memory system 400 may be implemented as an image processor like a digital camera, a cellular phone equipped with a digital camera, a smart phone equipped with a digital camera, or a tablet PC equipped with a digital camera.

The memory system 400 includes the non-volatile memory device 10 and a memory controller 440 controlling the data processing operations, such as a program operation, an erase operation, and a read operation, of the non-volatile memory device 10. The non-volatile memory device 10 and memory controller 440 are configured according to any of the embodiments described previously herein An image sensor 420 included in the memory system 400 converts optical images into digital signals and outputs the digital signals to a processor 410 or the memory controller 440. The digital signals may be controlled by the processor 410 to be displayed through a display 430 or stored in the non-volatile memory device 10 through the memory controller 440.

Data stored in the non-volatile memory device 10 may be displayed through the display 430 according to the control of the processor 410 or the memory controller 440. The memory controller 440, which may control the operations of the non-volatile memory device 10, may be implemented as a part of the processor 410 or as a separate chip.

Figure 12:
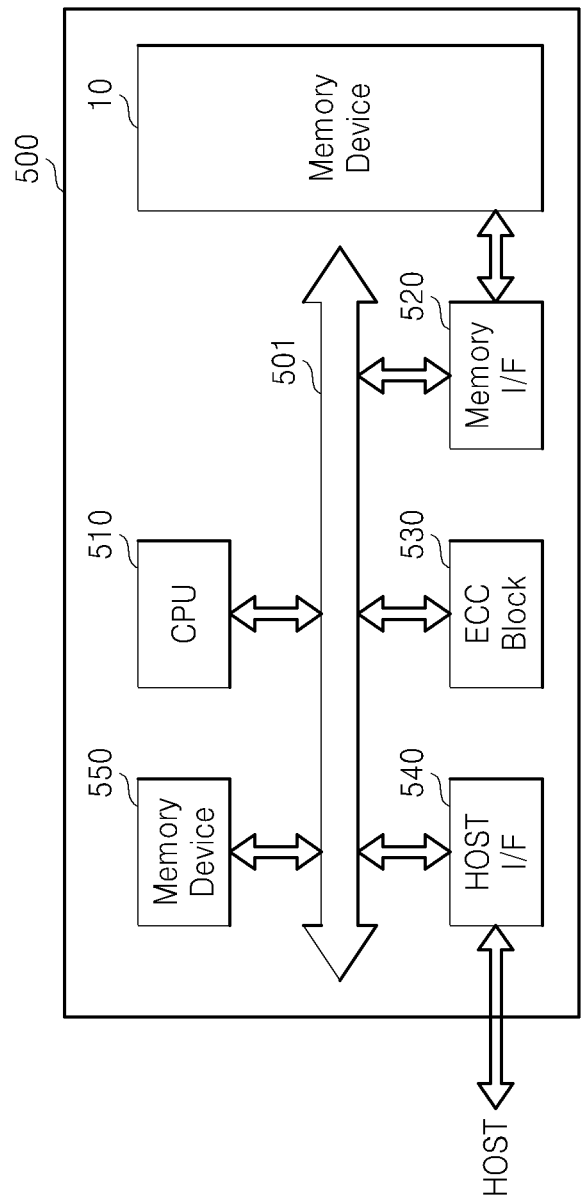

FIG. 12 is a block diagram of a memory system 500 including the non-volatile memory device 10 according to yet other embodiments of the inventive concepts. The memory system 500 includes the non-volatile memory device 10 and a central processing unit (CPU) 510 controlling the operations of the non-volatile memory device 10. The non-volatile memory device 10 and CPU 510 are configured according to any of the embodiments described previously herein.

The memory system 500 also includes a memory device 550 that may be used an operation memory of the CPU 510. The memory device 550 may be implemented by a non-volatile memory like read-only memory (ROM) or a volatile memory like static random access memory (SRAM). A host connected with the memory system 500 may perform data communication with the non-volatile memory device 10 through a memory interface 520 and a host interface 540.

An error correction code (ECC) block 530 is controlled by the CPU 510 to detect an error bit included in data output from the non-volatile memory device 10 through the memory interface 520, correct the error bit, and transmit the error-corrected data to the host through the host interface 540. The CPU 510 may control data communication among the memory interface 520, the ECC block 530, the host interface 540, and the memory device 550 through a bus 501. The memory system 500 may be implemented as a flash memory drive, a USB memory drive, an IC-USB memory drive, or a memory stick.

Figure 13:
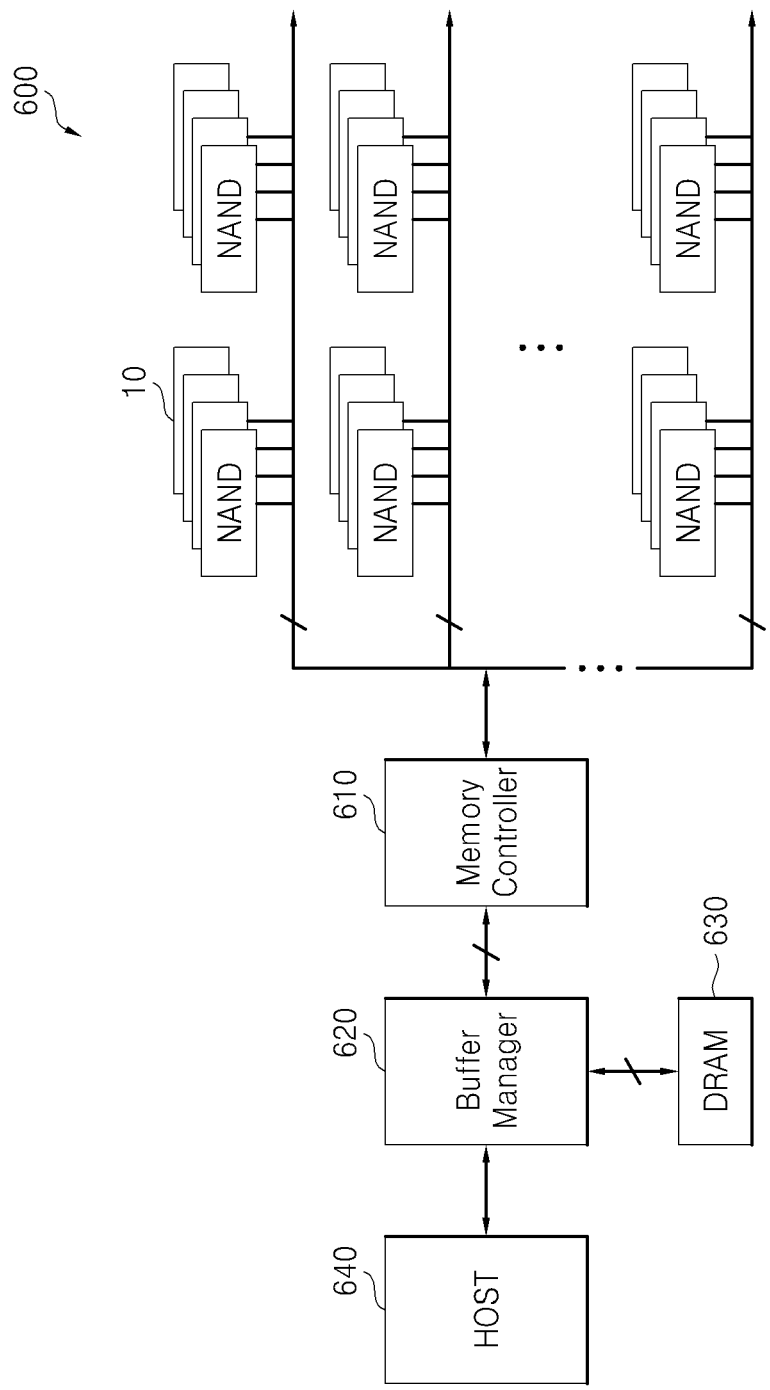

FIG. 13 is a block diagram of a memory system 600 including the non-volatile memory device 10 according to still other embodiments of the inventive concepts. The memory system 600 may be implemented as a data storage system like a solid state drive (SSD).

The memory system 600 includes a plurality of non-volatile memory devices 10, a memory controller 610 controlling the data processing operations of the non-volatile memory devices 10, a volatile memory device 630 like a dynamic random access memory (DRAM), and a buffer manager 620 controlling data transferred between the memory controller 610 and a host 640 to be stored in the volatile memory device 630. The non-volatile memory devices 10 and memory controller 6100 are configured according to any of the embodiments described previously herein.

Figure 14:
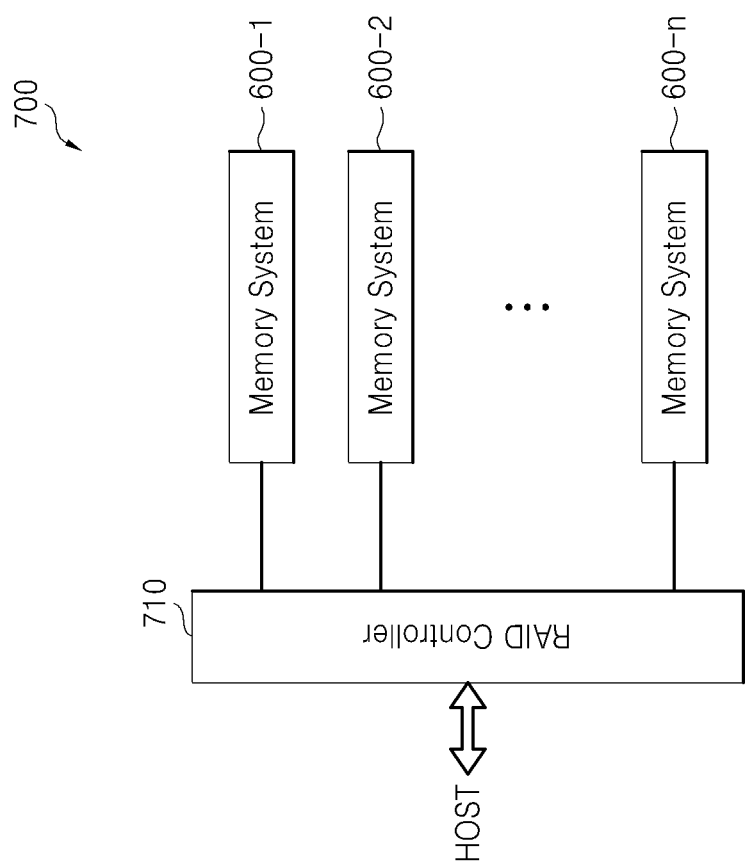
FIG. 14 is a block diagram of a data processing system which includes a memory system illustrated in FIG. 13 according to one or more embodiments of the inventive concepts.

FIG. 14 is a block diagram of a data processor 700 including the memory system 600 illustrated in FIG. 13. Referring to FIGS. 13 and 14, the data processor 700 may be implemented as a redundant array of independent disks (RAID) system. The data processor 700 includes a RAID controller 710 and a plurality of memory systems 600-1 through 600-*n* where "n" is a natural number.

Each of the memory systems 600-1 through 600-*n* may be the memory system 600 illustrated in FIG. 13. The memory systems 600-1 through 600-*n* may form a RAID array. The data processor 700 may be a PC or an SSD.

During a program operation, the RAID controller 710 may transmit program data output from a host to at least one of the memory systems 600-1 through 600-*n* according to a RAID level in response to a program command received from the host. During a read operation, the RAID controller 710 may transmit to the host data read from at least one of the memory systems 600-1 through 600-*n* in response to a read command received from the host.

While the inventive concepts has been particularly shown and described with reference to exemplary embodiments thereof, it will be understood by those of ordinary skill in the art that various changes in forms and details may be made therein without departing from the spirit and scope of the inventive concepts as defined by the following claims.

What is claimed is:

1. A method of programming a memory block of a non-volatile memory device operatively connected to a memory controller, the memory block defined by a plurality of word lines located between a string select line and a common source line corresponding to the string select line, the method comprising:
    programming a first sub-block of the memory block;
    determining in the non-volatile memory device when a reference word line is programmed during programming of the first sub-block;
    partial erasing a second sub-block of the memory block upon determining that the reference word line is programmed during programming of the first sub-block.

2. The method of claim 1, further comprising programming the second sub-block of the memory block after partial erasing the second sub-block.

3. The method of claim 1, wherein the partial erasing of the second sub-block is executed by the non-volatile memory device without receiving a corresponding partial erase command from the memory controller.

4. The method of claim 1, wherein the programming of the first sub-block comprises sequentially programming a first word line of the memory block through the reference word line of the memory block, wherein the first word line through the reference word line define the first sub-block of the memory block.

5. The method of claim 1, further comprising erasing the memory block before programming the first sub-block of the memory block.

6. The method of claim 5, wherein a partial erase time for partial erasing the second sub-block is less than a full erase time for erasing the memory block.

7. The method of claim 5, wherein erasing the memory block comprises applying a first erase voltage to the plurality of word lines of the memory block.

8. The method of claim 7, wherein partial erasing the second sub-block comprises applying a second erase voltage to word lines of the second sub-block, and a floating state to word lines of the first sub-block.

9. The method of claim 8, wherein the second erase voltage is greater than the first erase voltage.

10. The method of claim 8, wherein the second erase voltage is the same as the first erase voltage.

11. The method of claim 2, wherein the memory block includes $1^{st}$ through $N^{th}$ word lines arranged in order, where N is a plural number,
    wherein the programming of the first sub-block includes sequentially programming in order the $1^{st}$ word line through an $m^{th}$ word line of the memory block, where m is less than N, and the $m^{th}$ word line is the reference word line.

12. The method of claim 11, wherein the programming of the second sub-block includes sequentially programming an $(m+1)^{th}$ word line through the N word line, where the second sub-block is defined by the $(m+1)^{th}$ word line through the N word line.

13. The method of claim 11, wherein at least one word line is interposed between the reference word line and the second sub-block.

14. The method of claim 13, further comprising applying an intermediate voltage to the at least one word line during partial erasing of the second sub-block, the intermediate voltage being greater than a partial erase voltage applied to word lines of the second sub-block during partial erasing of the second sub-block.

15. The method of claim 1, wherein the reference word line is a first reference word line, and the memory block includes a third sub-block.

16. The method of claim 15, further comprising:
   determining in the non-volatile memory device when a second reference word line is programmed during programming of the second sub-block;
   partial erasing the third sub-block of the memory block upon determining that the second reference word line is programmed during programming of the second sub-block; and
   programming the third sub-block of the memory block after partial erasing the third sub-block.

17. The method of claim 15, wherein partial erasing the second sub-block includes partial erasing the third sub-block, and wherein the method further comprises:
   determining in the non-volatile memory device when a second reference word line is programmed during programming of the second sub-block;
   partial erasing the third sub-block of the memory block upon determining that the second reference word line is programmed during programming of the second sub-block; and
   programming the third sub-block of the memory block after partial erasing the third sub-block.

18. The method of claim 16, wherein the partial erasing of the second sub-block is executed by the non-volatile memory device without receiving a corresponding partial erase command from the memory controller.

19. The method of claim 1, further comprising retrieving an address indicative of the reference word line during a power-up of the non-volatile memory device.

20. The method of claim 1, wherein the non-volatile memory device generates a ready/busy signal, and wherein the method further comprises maintaining the ready/busy signal at a busy state during a continuous period including the programming of the reference word line and the partial erase of the second sub-block.

21. The method of claim 1, wherein the programming is a multi-level cell (MLC) programming in which a least-significant-bit (LSB) page and a most-significant-bit (MSB) page is programmed in the word lines of the memory block.

22. The method of claim 21, wherein the MLC programming is executed according to a shadow programming technique, and wherein the second sub-block is partially erased after the LSB page is programmed in the reference word line and before the MSB page is programmed in the reference word line.

23. The method of claim 1, wherein the memory block is a three-dimensional (3D) memory block, and wherein the first and second sub-blocks are 3D sub-blocks.

24. A method of programming a memory block of a non-volatile memory device operatively connected to a memory controller, the memory block defined by a plurality of word lines located between a string select line and a common source line corresponding to the string select line, the method comprising:
   programming a first sub-block of the memory block;
   determining in the memory-controller when a reference word line is to be programmed during programming of the first sub-block;
   transmitting a partial erase command from the memory controller to the non-volatile memory device upon determining that the reference word line is programmed during programming of the first sub-block;
   partial erasing a second sub-block of the memory block in response to the partial erase command; and
   programming the second sub-block of the memory block after partial erasing the second sub-block.

25. The method of claim 24, further comprising:
   registering an address of the reference word line in the non-volatile memory device; and
   transmitting the address of the reference word line to the memory controller before programming of the first sub-block.

26. The method of claim 25, wherein the registering the address of the reference word line includes reading the address of the reference word line during a power-up of the non-volatile memory device.

27. The method of claim 24, wherein programming the first sub-block and determining when the reference word line is programmed comprises:
   transmitting a sequence of program commands and a program addresses for the first sub-block from the memory controller to the non-volatile memory device, and when a transmitted program address is determined by the memory controller to correspond to the reference word line, subsequently transmitting the partial erase command from the memory controller to the non-volatile memory device.

28. The method of claim 27, wherein the non-volatile memory device generates a ready/busy signal which is readable by the memory controller, and wherein the method further comprises maintaining the ready/busy signal at a busy state during a first period including the programming of the reference word line, and maintaining the ready/busy signal at the busy state during a second period including the partial erase of the second sub-block, wherein the first period is separated from the second period.

29. The method of claim 24, further comprising erasing the memory block before programming the first sub-block of the memory block.

30. The method of claim 29, wherein a partial erase time for partial erasing the second sub-block is less than a full erase time for erasing the memory block.

31. The method of claim 24, wherein at least one word line is interposed between the reference word line and the second sub-block.

32. The method of claim 24, wherein the programming is a multi-level cell (MLC) programming in which a least-significant-bit (LSB) page and a most-significant-bit (MSB) page is programmed in the word lines of the memory block.

33. The method of claim 32, wherein the MLC programming is executed according to a shadow programming technique, and wherein the second sub-block is partially erased after the LSB page is programmed in the reference word line and before the MSB page is programmed in the reference word line.

34. The method of claim 24, wherein the memory block is a three-dimensional (3D) memory block, and wherein the first and second sub-blocks are 3D sub-blocks.

35. A non-volatile memory device, comprising:
   a non-volatile memory block defined by a plurality of word lines located between a string select line and a common source line corresponding to the string select line; and
   a control circuit configured to program a first sub-block of the memory block, to determine when a reference word line is programmed during programming of the first sub-block, and to partially erase a second sub-block of the memory block upon determining that the reference word line is programmed during programming of the first sub-block.

36. The non-volatile memory device of claim 35, wherein the control circuit is further configured to program the second sub-block of the memory block after partial erasing the second sub-block.

37. The non-volatile memory device of claim 35, wherein the control circuit is configured to partial erase the second sub-block without first receiving a corresponding partial erase command from an external device.

38. A memory system, comprising:
- a non-volatile memory device including a non-volatile memory block defined by a plurality of word lines located between a string select line and a common source line corresponding to the string select line, and a control circuit configured to execute program commands and partial erase commands on word lines of the non-volatile memory block; and
- a memory controller configured to transmit program commands to the non-volatile memory device to program a first sub-block of the memory block, to determine when a reference word line is programmed during programming of the first sub-block, to transmit a partial erase command from the memory controller to the non-volatile memory device upon determining that the reference word line is programmed during programming of the first sub-block, and to transmit program commands to the non-volatile memory device to program the second sub-block of the memory block after transmitting the partial erase command.

39. The memory system of claim 38, wherein the non-volatile memory device is further configure to register an address of the reference word line, and to transmit the address of the reference word line to the memory controller before the memory controller transmits the program commands to program the first sub-block.

40. The method of claim 1, wherein the partial erasing is performed where the second sub-block is in an erased state.

* * * * *